United States Patent [19]

Goldberg

[11] Patent Number: 5,553,151
[45] Date of Patent: Sep. 3, 1996

[54] ELECTROACOUSTIC SPEECH INTELLIGIBILTY ENHANCEMENT METHOD AND APPARATUS

[76] Inventor: Hyman Goldberg, 5096 Alejo St., San Diego, Calif. 92124

[21] Appl. No.: 260,317

[22] Filed: Jun. 15, 1994

Related U.S. Application Data

[63] Continuation of Ser. No. 944,209, Sep. 11, 1992, abandoned.

[51] Int. Cl.$^6$ ................................................. H04R 25/00
[52] U.S. Cl. ............................................ 381/68.4; 381/68
[58] Field of Search .......................... 381/68.4, 72, 107, 381/68, 94, 93, 106, 108; 341/139

[56] References Cited

U.S. PATENT DOCUMENTS

| | | | |
|---|---|---|---|
| 4,630,302 | 12/1986 | Kryter | 381/68.4 |
| 4,851,842 | 7/1989 | Iwamatsu | 341/139 |

*Primary Examiner*—Curtis Kuntz
*Assistant Examiner*—Sinh Tran
*Attorney, Agent, or Firm*—Brown, Martin, Haller & McClain

[57] ABSTRACT

One or more electronically-controllable blocks rapidly vary the device's acoustic gain. The electronically-controllable blocks variably amplify or attenuate the incoming signal, controlled by the output signals of one or more level detectors. The input signals of the level detectors are representative of the acoustic input signal being processed by the apparatus and produce controlling signals in response to detection of sound pressure levels within a predetermined range. Multi-level compression is achieved when a first level detector in conjunction with an electronically-controllable amplifier block compresses signals which have an input sound pressure level above a compressor lower bound $\alpha$ and below a compressor upper bound $\beta$, and when a second level detector in conjunction with either an electronically-controllable amplifier or attenuator block compresses signals which have a sound pressure level above a second compressor lower bound $\gamma$. For input signals of sound pressure level below $\alpha$ or between $\beta$ and $\gamma$, amplification is linear. Input amplifier saturation is prevented by having the second level detector alter the transmission of an electronically-controlled attenuator placed prior to the first stage of amplification. Single-level compression is provided by independent detection and utilization of compression ranges $\alpha$ to $\beta$ and over $\gamma$.

22 Claims, 8 Drawing Sheets

ELECTROACOUSTIC SPEECH INTELLIGIBILTY ENHANCEMENT METHOD AND APPARATUS

This is a continuation of application Ser. No. 07/944,209, filed Sep. 11, 1992, now abandoned.

BACKGROUND OF THE INVENTION

I. Field of the Invention

The present invention relates to an improved electroacoustic speech processing method and apparatus with applicability in hearing aids and all types of electroacoustic assistive communication devices.

II. Background of the Invention

The most fundamental ability adversely affected by impaired hearing is the ability to communicate through speech, primarily due to an inability to sense weak sounds. The improvement of speech intelligibility for a hearing impaired listener who experiences difficulty when using a hearing prosthesis has long been recognized as a technical challenge. Many techniques have been utilized to alleviate the problem. Early methods for improving hearing were limited to systems which increased the loudness of sound and/or altered the frequency characteristics of sound in a fixed manner. In terms of electroacoustic apparatus, this means that linear and time-invariant amplifying and filtering systems were employed. Such systems increase the amplitude of sound and may introduce greater gain at some frequencies than at others. Many currently believe that hearing impairment can be substantially corrected by 1) determining the threshold of sensitivity at various frequencies, 2) comparing those threshold levels to those of normal hearing persons, and 3) supplying a hearing aid which amplifies and filters incoming sounds in a linear and time-invariant fashion such that the measured loss at those various frequencies, or some part thereof, is compensated. This type of system, however, only partially addresses the needs of hearing impaired persons. The complexities involved which limit the effectiveness of the above-described testing and fitting method derive from both the complex acoustic nature of speech and also from the physiological and psychological characteristics of hearing loss.

People who are considered to possess normal hearing have the ability to perceive speech sounds in the frequency range of about 125 Hz to about 6 KHz at 20 dB SPL or weaker and, depending upon the frequency content of the sound, can tolerate sounds as loud as 105 dB SPL. ("0 dB SPL" or "0 decibels Sound Pressure Level" is defined as 0.0002 dynes/cm$^2$.) Note that threshold of sensitivity for pure tones in sound field is dependent upon tone frequency and is affected significantly by the age of the listener. Measured thresholds of sensitivity may also be affected by testing method. (Two references discussing normal hearing thresholds are 1) "International Organization for Standardization Recommendation R226: Normal Equal-Loudness Contours for Pure Tones and Normal Threshold of Hearing Under Free Field Listening Conditions" and 2) Sivian, L. J. and White, S. D., "On Minimum Audible Sound Fields", *Journal of the Acoustical Society of America*, 1933, volume 4.) Those with the best hearing are able to perceive sounds as weak as −4 dB SPL at some frequencies. Sounds with amplitude below about 20 dB SPL, therefore, may not be perceptible by many, and sounds above 105 dB SPL cause discomfort in many listeners. Sounds above 120 dB SPL can actually cause pain (see FIG. 2). At 1000 Hz, for example, the threshold of hearing sensitivity for a normal individual may be 20 dB SPL and the threshold of discomfort may be 105 dB SPL. Obviously, the thresholds of hearing sensitivity for those with impaired hearing are at greater sound pressure levels than for those with normal hearing, however, the thresholds of hearing discomfort are most often not similarly elevated. In fact, in most cases, the thresholds of hearing discomfort for those with hearing impairments are at lesser sound pressure levels than for normals.

In hearing impaired persons, elevated thresholds of sensitivity in conjunction with thresholds of discomfort that are the same as or lower than those of normals result in a reduced dynamic range of amplitudes over which the hearing impaired person can usefully perceive acoustic information. Whereas normal hearing individuals typically have a dynamic range of hearing of 85 dB, and some have a dynamic range as large as 110 dB or more, the range of usable sound amplitude is reduced in virtually all hearing impaired persons. Speech consists of louder sounds, such as vowels, and softer sounds such as the consonants \t\ and \f\. For speech to be easily understandable, the softer sounds must be heard and the louder sounds must not be so loud as to either cause discomfort or to interfere with the perception of weaker following sounds, a phenomenon known as "forward masking". Thus, there is a level of speech for every individual which can be called the "Preferred Listening Level" or PLL. For normal hearing persons, the PLL is around 70 dB Sound Pressure Level, and although a hearing impaired individual may have thresholds of sensitivity which are elevated significantly as compared to normal, the PLL for mild or moderately hearing impaired persons, when not wearing a hearing aid, is similar to or only moderately elevated in comparison to that of a normal. Reduced dynamic range along with an unaided PLL near normal are primary reasons why linear amplification does not satisfy the needs of the hearing impaired.

Consider a simple linear amplification system with a gain of 30 dB fitted on an individual whose threshold of sensitivity is 50 dB SPL and whose threshold of discomfort is 95 dB SPL. In this case, sounds at 20 dB SPL, a normal threshold of sensitivity, would be amplified to 50 dB SPL by the hearing aid before presentation to this individual and would therefore be perceptible. A sound near the level of discomfort, say at 80 dB SPL, however, would be introduced to this hearing aid user at 110 dB SPL and this level is unacceptably loud. Moreover, a sound at a conversational level (Preferred Listening Level) of 70 dB SPL, for example, would be introduced to this hearing aid user at 100 dB SPL which would be perceived as being abnormally loud and is, in fact, above the threshold of discomfort. Therefore, this linear amplification system is not desirable. When fitted with a linear hearing aid, a hearing impaired user generally does not set the loudness control to a level which corrects his or her thresholds of sensitivity because, with that amount of gain, 30 dB in this example, normal conversational levels will contain sounds which are uncomfortably loud.

The intensity range or dynamic range of speech is approximately 27 dB when the talker is one meter from the listener, that is, the difference in loudness between the strongest and weakest phonemic elements of speech is about 27 dB. Due to both the absorptive dispersive nature of sound propagation in air and the presence of acoustic reflections, when the distance between the talker and listener increases, the average amplitude of speech is lowered and the dynamic range of speech may actually increase. For women talkers, the average Sound Pressure Level of speech at one meter distance is about 65 dB and for men the average is about 70 dB. Moreover, when the full array of listening situations is considered, from quiet speech to shouting, the range of average speech Sound Pressure Level is from about 40 dB to over 90 dB. It is understood that the primary purpose of a hearing aid device is to enhance the ability of the hearing impaired person to understand speech, and such a device must have utility over a broad range of listening situations.

Reduced dynamic range of hearing interferes with the perceived loudness relationships between phonemes in hearing impaired listeners. This is referred to as "loudness distortion". For example, in the word "ball", the stronger phoneme, the vowel \o\ (17 in FIG. 1), may be at a level of approximately 85 dB SPL while the \b\ (14 in FIG. 1), which is the weakest phoneme of the word, would be at a level of 66 dB SPL, a difference of 19 dB. Note that the normal listener has a dynamic range of about 85 dB while the hearing impaired listener, depending on the severity of the loss, may have a dynamic range of only 40 dB. Assuming that speech is amplified (linearly) such that the \b\ is audible by the hearing impaired listener, the difference in level between the weakest and loudest sounds of the word "ball" spans a much greater portion of the dynamic range of the hearing impaired listener, 19 dB of a total range of 40 dB, as compared to the normal listener, 19 dB of a total range of 85 dB. Thus, the hearing impaired listener perceives a much greater difference in loudness between these two sounds because the \b\ is close to his or her threshold of sensitivity, which is abnormally high in comparison to a normal hearing listener, and the \o\ is close to his or her threshold of discomfort. Phonemic loudness distortion is extremely detrimental to speech intelligibility.

In an effort to eliminate the adverse effects of loud sounds being presented to a hearing aid user at levels near or greater than the threshold of discomfort, many early hearing aid designs incorporate limiting circuitry which clips any signal waveform whenever a set clipping threshold near the user's threshold of discomfort is exceeded. This technique introduces severe harmonic distortion. Although sounds of excessive loudness are prevented by waveform clipping, the resultant distortion can interfere greatly with the ability to understand speech. In addition, phonemic loudness distortion is not fully addressed because the loudness relationships amongst all phonemes that do not exceed the clipping threshold are not altered.

An alternative to waveform clipping is a technique called "compression limiting". Compression limiting also prevents loud sounds from being presented to the user, but rather than clipping the waveform, the gain of an amplifier is reduced when loud sounds are present above the compression limiting threshold, set near the user's threshold of discomfort. A benefit of compression limiting is that the high level of harmonic distortion introduced by waveform clipping is not present. However, phonemic loudness distortion is not fully addressed by this technique either, as the loudness relationships amongst all phonemes that do not exceed the compression limiting threshold are not altered. In addition, a phenomenon known as "pumping" may occur in compression limiting systems in the presence of high levels of background noise. Pumping occurs because, in the absence of speech or louder signals above the compression limiting threshold, this hearing aid will exhibit its highest gain. Thus, amplified background noise levels increase during the normal gaps in speech and is perceived as a fluttering or pumping sound.

Another aspect of hearing impairment involves abnormality in the loudness relationship between various frequencies.

For example, many hearing impaired listeners have greater loss of sensitivity at high frequencies such as 4000 Hz as compared with lower frequencies such as 500 Hz, as measured with pure tone standard hearing tests (see FIG. 12). Hearing aid designers have attempted to correct for this particular and common abnormality by including a simple filter in a system with a linear amplifier such that higher frequencies are amplified more than lower frequencies. This technique is generally inadequate because the hearing impaired person's thresholds of sensitivity as a function of frequency differ from his or her frequency response (as derived from loudness balance testing) at PLL. When studies of pure tone sound pressure levels which produce equal perception of loudness for normal listeners are compared to similar studies for hearing impaired listeners, it is clear that the distortion of loudness as a function of frequency caused by hearing impairment is level dependent. Simple filtering circuitry does not compensate for this phenomenon.

Consider an individual with the following characteristics of impaired hearing: a) threshold of sensitivity at 1000 Hz is 50 dB SPL, b) threshold of sensitivity at 4000 Hz is 70 dB SPL, c) at PLL, 80 dB, the loudness balance response is reasonably flat, d) threshold of discomfort at 1000 Hz is 95 dB SPL and e) threshold of discomfort at 4000 Hz is also 95 dB SPL. In an attempt to fit this particular individual such that he exhibits normal thresholds of sensitivity, say 20 dB SPL at 1000 Hz and 15 dB SPL at 4000 Hz, he or she is fitted with a hearing aid providing 30 dB of gain at 1000 Hz and 55 dB of gain at 4000 Hz. After fitting, normal thresholds of sensitivity result. However, with incoming signals at both 1000 Hz and 4000 Hz at a level, for example, of 50 dB SPL, the hearing aid's output at 4000 Hz would be above the level of discomfort, 105 dB SPL, and the output at 1000 Hz would be only 15 dB below the level of discomfort, 80 dB SPL. Clearly, the loudness balance relation between 1000 Hz and 4000 Hz as presented to the hearing impaired listener in this situation is not normal, although his sensitivity at both 1000 Hz and 4000 Hz has been corrected. It is desirable for hearing aid systems to compensate for level-dependent frequency response distortions of this nature.

As previously mentioned, forward masking is a significant problem in speech perception of hearing impaired individuals. When a soft sound above the listener's threshold of sensitivity is presented immediately following a loud sound, the listener's perceived loudness of the soft sound is reduced. This phenomenon may be due to the hearing system's self-protecting mechanism and its inability to rapidly recover from the presence of the loud sound. (See e.g., Lüscher and Zwislocki "The Decay of Sensation and the Remainder of Adaptation after Short Pure-tone Impulses on the Ear", *Acta Otolaryngology*, 1947, volume 35, pp. 428–445.) In normal hearing persons, this phenomenon is slight enough not to interfere with speech perception, however, the hearing impaired listener exhibits an increased difficulty in recognizing soft phonemes which are preceded by loud phonemes. This may in part be caused by the impaired ear's inability to recover from a loud sound as rapidly as a normal ear in combination with the fact that the difference in perceived loudness of a strong phoneme in comparison to a weak phoneme is greater in hearing impaired individuals due to their reduced dynamic range. Examples of soft phonemes immediately following loud phonemes abound in speech, such as the \th\ in "bath" preceded by the \a\. It is desirable for hearing aid systems to be designed in a manner which lessens forward masking of soft phonemes by preceding loud phonemes.

Finally, the difficulty which many hearing impaired individuals experience understanding speech in high level noisy environments, where the noise level is greater than 65dB, should be addressed. It is well-known that noise is predominantly low-frequency energy. Some hearing aid designs therefore incorporate a user-operated switch which can be activated to attenuate low frequency energy. The user may use this switch to improve his understanding in noisy environments. It is desirable in many cases for a hearing aid system to provide automatic low-frequency cut in highly noisy environments.

U.S. Pat. No. 3,229,049 of the present inventor introduced the concept of "progressive range" or "log-linear" compression in which incoming acoustic signals covering a substantial portion of the dynamic range of normal hearing individuals are compressed such that the dynamic range of the hearing aid's acoustic output signal falls within the range between the hearing impaired person's threshold of sensitivity and threshold of discomfort. According to this invention, the gain of an amplifier reduces as the incoming signal sound pressure level increases above a compression threshold or knee. A hearing aid which fits this description amplifies incoming sounds below 35 dB SPL linearly with a gain of 30 dB and compresses incoming sounds between 35 dB and 110 dB SPL into an output range of 65 dB to 95 dB SPL. In this case, as Sound Pressure Levels rise above 35 dB, there is an average 1 dB increase of output signal amplitude for every 2.5 dB increase of input signal amplitude. This corresponds to a compression ratio of 2.5.

Some of the key shortcomings of the invention of the '049 patent result from the influence of background room noise on the perception of speech.

Background room noise may typically be at 50 dB SPL average. Using the same gain and compression described above, this noise is presented to the hearing aid user at 71 dB average. Consider the word "ball" containing the vowel \ò\ 17 and the consonant \b\ 14, spoken at a level such that the \ò\ sound is at 75 dB SPL and the \b\ at a level near 56 dB SPL. As processed by the log-linear compressor, the \b\ would then be presented to the user at 73.4 dB. Recognizing that background noise varies in intensity and contains transient sound which exceeds its average level, and noting that the \b\ is presented only 2.4 dB above the average background noise level, it is apparent that this hearing aid user will likely have difficulty in reliably perceiving the \b\ and other weak phonemes in speech with such room noise present. Also, the difference in amplitude between vowels and consonants as presented to the user may be large enough that forward masking of weak consonants will occur. Additionally, in the absence of speech or louder signals, including the gaps in normal speech, this hearing aid will exhibit its highest gain, causing the previously-discussed pumping sound heard in compression limiting systems.

Killion (U.S. Pat. No. 4,170,720) discloses a log-linear compression system which operates over the range of 30 dB to 90 dB input SPL. A distinguishing feature of this system is that the amplification is linear above about 90 dB input SPL, however the difficulties associated with the '049 patent also apply to this system.

A detrimental artifact of the invention of the '049 patent, and other similar designs, involves the saturation of the first amplifying stage of the system whenever extremely high level input signals are present. This reduces the dynamic range of acoustic input signals that can be processed by the device without distortion. In an embodiment of Killion, a field effect transistor located at the input and controlled by the output signal is included to attenuate extremely high level input signals.

In co-pending application Ser. No. 07/722,344, a compression system is disclosed with the knee placed at an input sound pressure level of, for example, 55 dB SPL and with a higher compression ratio of, for example, 5. The user of such a system would be unlikely to turn up the loudness sufficiently to correct his or her threshold because usual speech would then be presented at too high a level. This system provides better speech perception in the presence of noise at the expense of not fully correcting threshold response.

Kryter (U.S. Pat. No. 3,894,195) describes a complex system in which "automatic nonlinear-linear gain control" is utilized along with a plurality of frequency filtering paths to discriminate between noise and speech and reduce the aforementioned pumping effect. In a later patent (U.S. Pat. No. 4,630,302), Kryter discloses a method and apparatus which utilizes two fast attack/slow recovery time automatic gain control sections for compressing the wide amplitude range of speech followed by a slow attack/fast recovery automatic gain control section for noise suppression.

Graupe, et al., (U.S. Pat. Nos. 4,025,721 and 4,185,168) have explored the use of adaptive filtering for removal of near-stationary noise from speech. Graupe's largely digital systems involve the continual analysis of the spectral and temporal characteristics of the incoming signal to determine whether or not a desired information-bearing signal is present.

Steeger (U.S. Pat. No. 4,508,940) presented a hearing aid with multi-channel compression which avoids some of the space and power requirements of all-digital schemes through the use of sampled-data analog techniques. Franklin (U.S. Pat. No. 4,461,025) discloses another means of background noise suppression which utilizes a slow attack fast recovery automatic gain control circuit to determine whether an incoming signal contains no speech information and reduces the gain of the hearing aid at such times; however, Franklin does not address phonemic loudness distortion in his invention. Fukuyama, et al., (U.S. Pat. No. 4,476,230) describes a hearing aid which automatically decreases the maximum output sound level when necessary to prevent sounds of uncomfortable loudness from being introduced to the user, and this system also fails to consider phonemic loudness distortion. Hotvet's automatic gain control (U.S. Pat. No. 4,718,099) provides a compressor with variable recovery time responsive to adapt to various types of signals encountered by the hearing aid user.

SUMMARY OF THE INVENTION

The present invention is an apparatus and method which can significantly ameliorate hearing difficulties and provide improvement of hearing thresholds to normal levels while being psychologically acceptable to the user.

It is an advantage of the present invention to prevent presentation of signals to the user which exceed his or her threshold of discomfort, while processing a wide dynamic range of input signals without introducing significant distortion.

It is a further advantage of the present invention to provide a system which, while processing speech such that it falls within the usable dynamic range of a hearing impaired listener, can also moderate the interfering (masking) effects of amplified background noise.

It is another advantage to provide an apparatus which provides phonemic speech processing such that the individual phonemes in speech are processed to enable the listener to perceive phonemes without interference by preceding phonemes due to forward masking phenomena.

Another advantage of the present invention is to eliminate the detrimental artifact of pumping caused by compression circuitry.

Still another advantage is to provide a system which eliminates the detrimental effects of extremely loud sounds which saturate the first amplifying stage.

Yet another advantage is to provide a device which incorporates adaptive filtering to help rectify the problem of hearing-impaired individuals whose frequency response at the threshold of sensitivity differs significantly from the frequency response as derived from loudness balance testing at the Preferred Listening Level.

In a first exemplary embodiment, the apparatus and method of the present invention feature phonemic speech processing and circuitry incorporating at least one electronically-controllable blocks designed to rapidly vary the device's acoustic gain. Individual phonemes of speech are processed in a manner consistent with amelioration of the hearing difficulty while significantly moderating the interfering qualities of amplified background noise, such as masking of weak phonemes and background noise flutter. The electronically-controllable block variably amplifies or attenuates the incoming signal, controlled by the output signals of one or more level detectors. The input signal of each level detector is representative of the acoustic input signal being processed by the apparatus, and is unaffected by the adjustment of the loudness control. The level detector circuits have rapid attack and recovery times.

In a second exemplary embodiment of the apparatus, a first level detector in conjunction with an electronically-controllable amplifier block automatically adjusts the gain for input signals which have a sound pressure level above a compressor lower bound $\alpha$, and below a compressor upper bound $\beta$, set at a level which depends on the user's hearing threshold. Extra gain is provided for low level input signals and not provided for inputs of level greater than $\beta$. In order that the first level detector not impact the amplifier gain when the acoustic input signal level is above $\beta$, a limiting means, such as a limiter circuit at the input of the detector, is provided. For input signals greater than $\alpha$ and less than $\beta$, this embodiment exhibits compression, and for inputs below $\alpha$ and greater than $\beta$ amplification is linear.

To this embodiment may be added a second level detector in conjunction with an electronically-controllable attenuator block placed prior to the first amplifying stage to reduce the amplitude of input signals which have a sound pressure level above a compressor lower bound $\gamma$, which is above $\beta$, typically set at 75 dB SPL. This configuration provides compression for SPLs above $\gamma$, limiting the linear region above $\beta$, and eliminates input amplifier saturation caused by extremely loud sound pressure levels.

In a third exemplary embodiment, a single electronically-controllable amplifier block automatically adjusts the gain for input sound pressure levels between $\alpha$ and $\beta$ as directed by the output of a first level detector, and the same electronically-controllable amplifier block automatically adjusts the gain for input sound pressure levels exceeding $\gamma$ as directed by the output of a second level detector. For input signals of sound pressure level between $\beta$ (the first compressor upper bound) and $\gamma$ (the second compressor lower bound), amplification is linear. Amplification is also linear for signals below $\alpha$. A limiting means associated with the first level detector is provided such that the detector output signal impacts gain only when the input sound pressure level is between $\alpha$ and $\beta$.

In a fourth exemplary embodiment, an electronically-controllable attenuator block is placed prior to the first amplifying stage, and the attenuator transmission is controlled by a level detector for input sound pressure levels greater than $\gamma$. This embodiment is the same as the second half of the second exemplary embodiment. The attenuation before the first amplifier prevents unwanted overloading by excessively high input signal levels.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENTS

Figure 3:
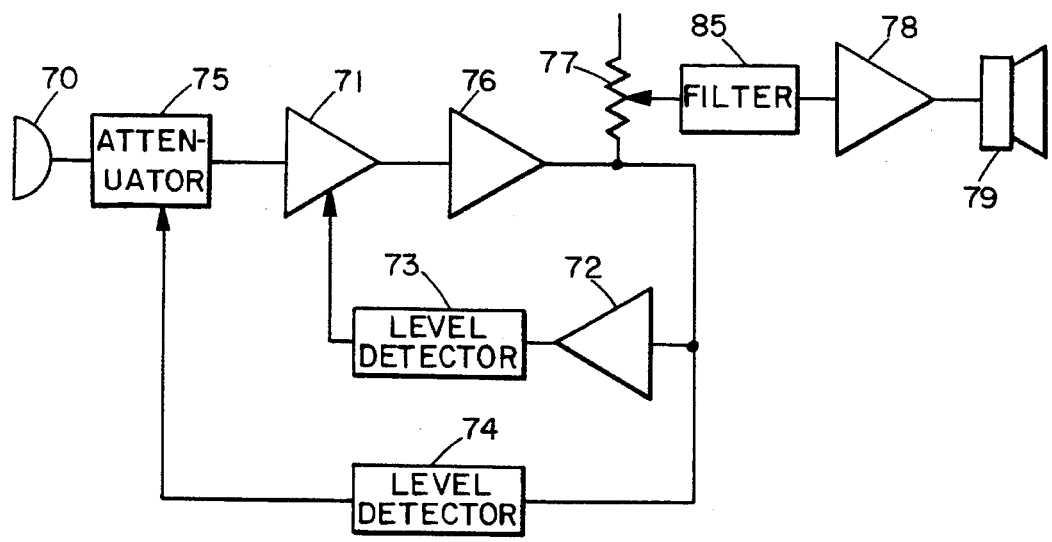
FIG. 3 is a block diagram of a first embodiment of the speech enhancement system incorporating multi-level compression.
Figure 14:
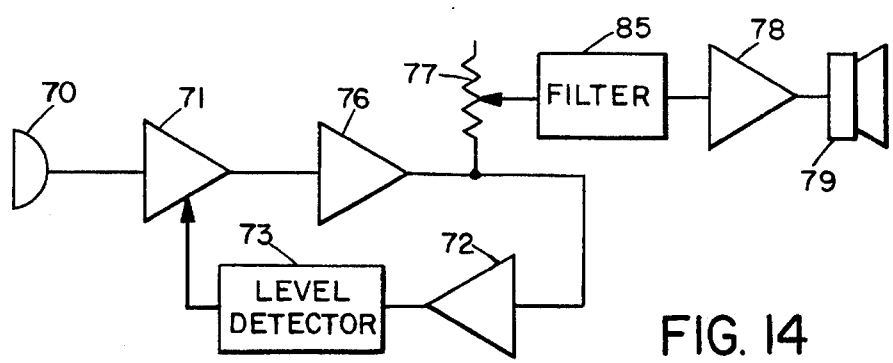
FIG. 14 is a block diagram of a single-level compression system for compression of input SPLs between $\alpha$ and $\beta$.
Figure 15:
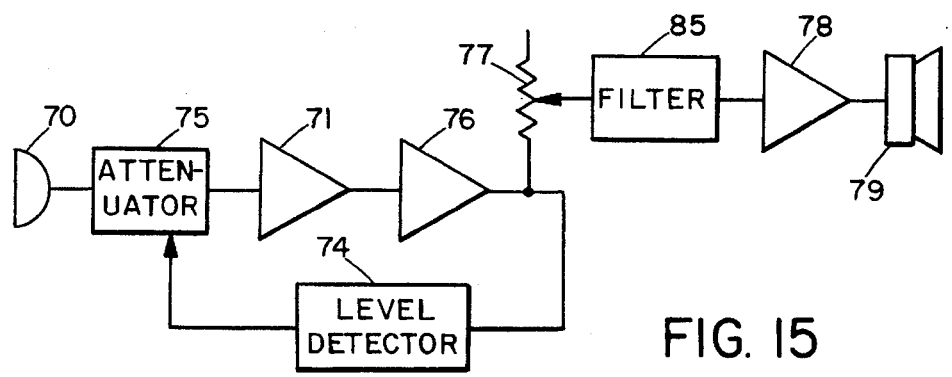
FIG. 15 is a block diagram of a single level compression system for compression of input SPLs above $\gamma$.

FIGS. 14, 15 and 3 show the block diagrams of a first embodiment of the present invention and illustrates the single-level compression elements that can stand alone to provide improved speech intelligibility or can be combined to provide the preferred multi-level compression technology. A hearing aid microphone or other acoustic input device 70 is connected to the input of an electronically-controllable attenuator block 75. The output from the attenuator 75 is fed into an electronically-controllable amplifier block 71, and the output of amplifier 71 is fed to another amplifier 76 which acts as a buffer between 71 and the remainder of the circuitry. The output of buffer amplifier 76 feeds the loudness control 77 and level detector 73.

The detector 73, referred to as the first detector, in conjunction with the electronically-controllable amplifier block 71, automatically and rapidly adjusts the system gain for low-level input signals of sound pressure level in a specified range, between the first compressor lower bound, $\alpha$, and the first compressor upper bound, $\beta$. The limiting function of 72 prevents signals greater than $\beta$ from further increasing the signal at the input of detector 73 and the amplifying function of 72 is necessary to provide detector 73 with sufficient input at low signal levels. These elements provide the compression control of the single-level compression device illustrated in FIG. 14.

The detector 74 introduced in FIG. 15, referred to as the second detector, in conjunction with the electronically-controllable attenuator block 75, reduces the amplitude of high-level input signals of sound pressure level greater than the second compressor lower bound, $\gamma$. These elements provide compression control of the single-level compression system of FIG. 15.

When the single-level systems are combined as in FIG. 3, $\gamma$ is always greater than $\beta$. Amplifier block 71 and attenuator block 75 in conjunction with the buffer amplifier 76, the detectors 73 and 74, and the amplifier/limiter 72 comprise the compression control subsystem of the multi-level compression device illustrated in FIG. 3. For all systems in FIGS. 14, 15 and 3, the loudness control adjusts the output signal level of the device while having no effect on the compression control subsystem. The signal adjusted by the loudness control may be fed through an optional filter 85, and then is fed into power amplifier 78, which in turn drives a hearing aid receiver, loudspeaker, or other acoustic output device 79. The block diagrams of the compression systems of the present invention are showed as possessing a single channel from input to output. It is known in the art that input signals can be split in any number of ways, then recombined at the output. For example, when combining the single-level compression systems of FIGS. 14 and 15, a single channel for each system can be provided so that multi-level compression is still attained. Thus, the invention is not intended to be limited to single channel applications, and will function equally successfully if the input signal is divided into separate components, then recombined prior to output.

A graphical representation of the acoustic output level in decibels as a function of the acoustic input level in decibels at a particular frequency is called the "compression curve"; and the "compression ratio" is defined as the inverse slope of the compression curve: a small change in input level in decibels divided by the resulting change in output level in decibels (Braida, et al., "Hearing Aids—A Review of Past Research on Linear Amplification, Amplitude Compression, and Frequency Lowering, American Speech-Language-Hearing Association Monograph Number 19, Rockville, Md., April, 1979, pp 54–59). Linear amplification, by definition, exhibits a compression ratio of one. For example, a hearing aid with a knee of 75 dB input SPL which compresses sound between 75 dB and 110 dB SPL into an output range spanning 5 dB has a compression ratio of one. "CR" will be used to denote the average compression ratio above the compressor threshold or "knee".

Another parameter of concern is the "recovery time" of the compressor circuitry. An accepted definition of recovery time (Braida, et al.) is "the time required for the output of a compressor to return to within 2 dB of the level specified by the compression curve after the input level decreases at least 20 dB from a level that was above the compression threshold". Similarly, the "attack time" (Braida, et al.) is "the time required for the output of a compressor to come within 2 dB of the level specified by the compression curve after the input level increases by at least 20 dB to a level above the compression threshold".

For input signals of amplitude less than $\alpha$, neither the first detector 73 nor the second detector 74 produce significant signals at their outputs. The amplifier 71 exhibits its maximum gain and the attenuator 75 exhibits its maximum transmission (minimum attenuation) for input signal levels below $\alpha$. For low intensity input signals less than $\alpha$, amplification is linear and the system's acoustic gain is $G_0$. As the input signal amplitude increases from $\alpha$ to $\beta$, the gain of block 71 progressively decreases and the system exhibits compression. For greater input amplitudes, the limiter/amplifier 72 is saturated, preventing the output signal of the first detector 73 from changing further; and the system's acoustic gain is fixed at $G_1$ for input signals of amplitude greater than $\beta$ and less than $\gamma$. For input signals greater than $\gamma$, the second level detector 74 output causes the attenuation through block 75 to increase, thereby providing a second region of compression.

The input device 70 may be an acoustic transducer of a type other than a standard hearing aid microphone, or an electronic signal representative of an acoustic signal may be fed into the device for processing. The input signal could, for example, be the output of a speech recording device such as an audio tape recorder, or the sound portion of a television broadcast. The electronically-controllable attenuator 75 incorporates no active components (transistors) in the signal path and attenuates the electrical signal fed to it by input device 70 according to the signal at its control input. The second level detector 74 produces an output signal which interfaces with the control input of the electronically-controllable attenuator 75. The output of the attenuator 75 is fed into amplifier 71. Amplifier 71 amplifies its input signal to produce an electrical output signal, its gain being controlled by the signal at its gain-control input. The output of the first level detector 73 is designed to interface with the control input of 71 in order to control its gain.

Figure 1:
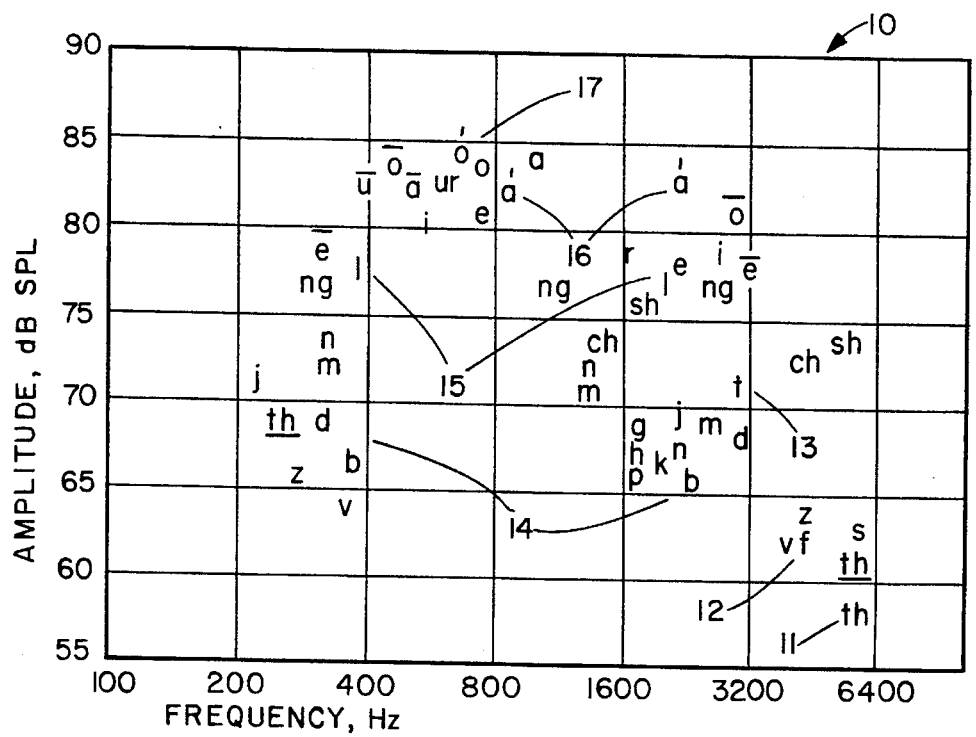
FIG. 1 is a chart of amplitude and frequency characteristics of the fundamental speech sounds.

In order to clarify the means utilized by the various embodiments of this invention to enhance speech intelligibility, consideration must be given to the characteristics of the fundamental sounds of speech. FIG. 1, which is an adaptation of a published chart by Harvey Fletcher from *Speech and Hearing in Communication* (1953, Van Nostrand Company, page 87), shows acoustic characteristics of most of the phonemes of speech in an average listening situation. The plot of amplitude versus frequency, indicates the relative amplitudes of the various phonemes as well as their approximate spectral content. The phoneme \th\ 11, as in the word "thin", is the weakest sound in speech included on the chart and the vowel \o\ 17, as in the word "ball", is the strongest phoneme in speech. The difference in amplitude between the weakest phoneme 11 and the strongest phoneme 17 represents the dynamic range of speech sounds for an average listening situation, approximately 27 dB. It is important to note that the average sound pressure level of a whisper may be 50 dB less than that of a shout. Therefore, even though a given listening situation may have phonemes spanning a range of about 27 dB in intensity, a device for the enhancement of speech intelligibility must process sounds over a much wider range of intensities, preferably 80 dB or greater. FIG. 1 also indicates other weak consonants such as \f\ as in "fan", 12, and \t\ as in "bat", 13. It is these weaker sounds that are the most difficult for the hearing impaired to distinguish and also the most likely to be masked due to either interfering noise or forward masking effects. Note also that some of the phonemes have spectral energy in more than one region of the chart, such as \b\ 14, \l\ 15, and \á\ 16. To achieve the best phoneme perception it is important that the full frequency range encompassing a phoneme be heard. In the case of \b\, for example, a listener must perceive low levels of acoustic energy in the region of 350 Hz as well as in the region of 2500 Hz. If energy in either of these spectral regions is not heard, a listener may confuse the \b\ with some other consonant.

Figure 2:
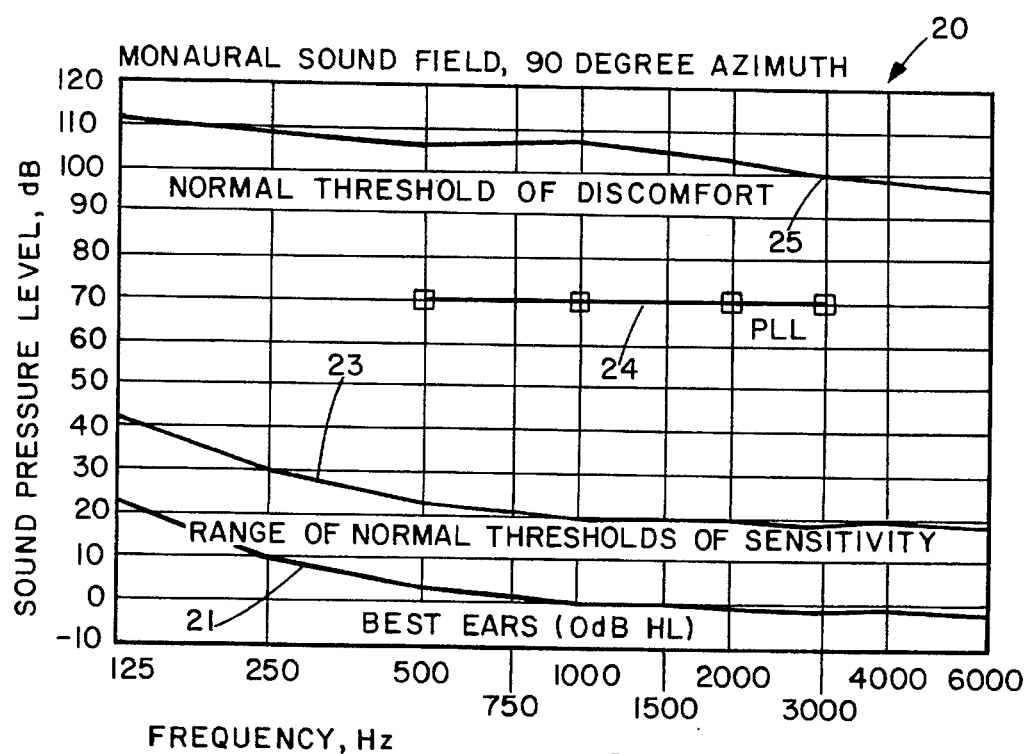
FIG. 2 is a reference Sound Pressure Level Complex Audiogram.
Figure 11:
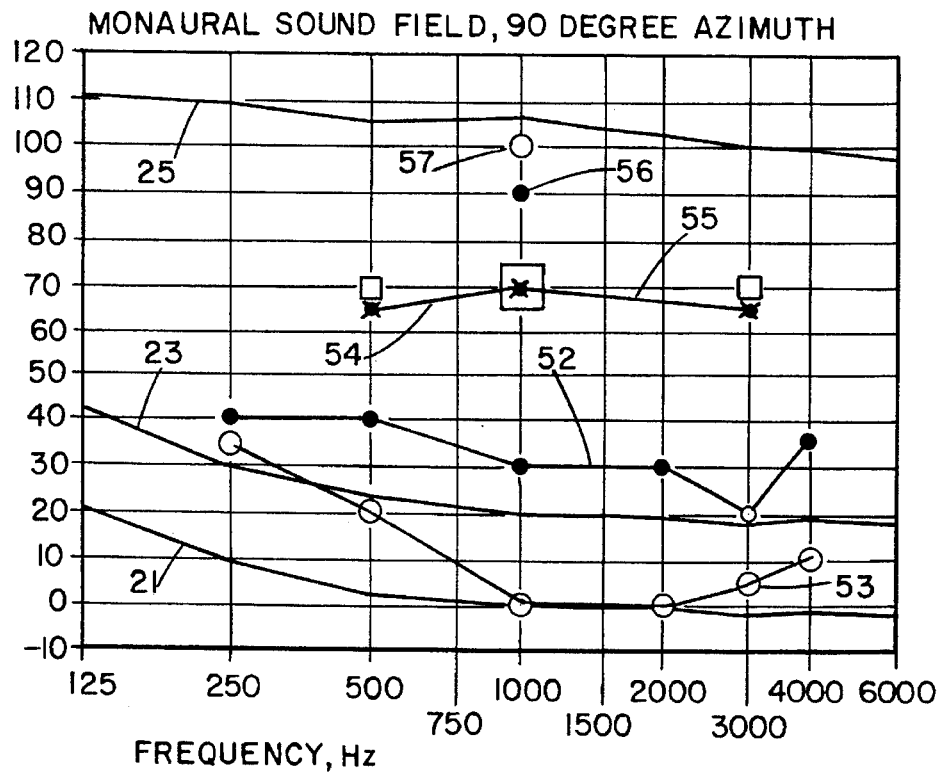
FIG. 11 is an example of a Sound Pressure Level Complex Audiogram of a mildly hearing impaired individual showing both unaided and actual aided measurements.
Figure 12:
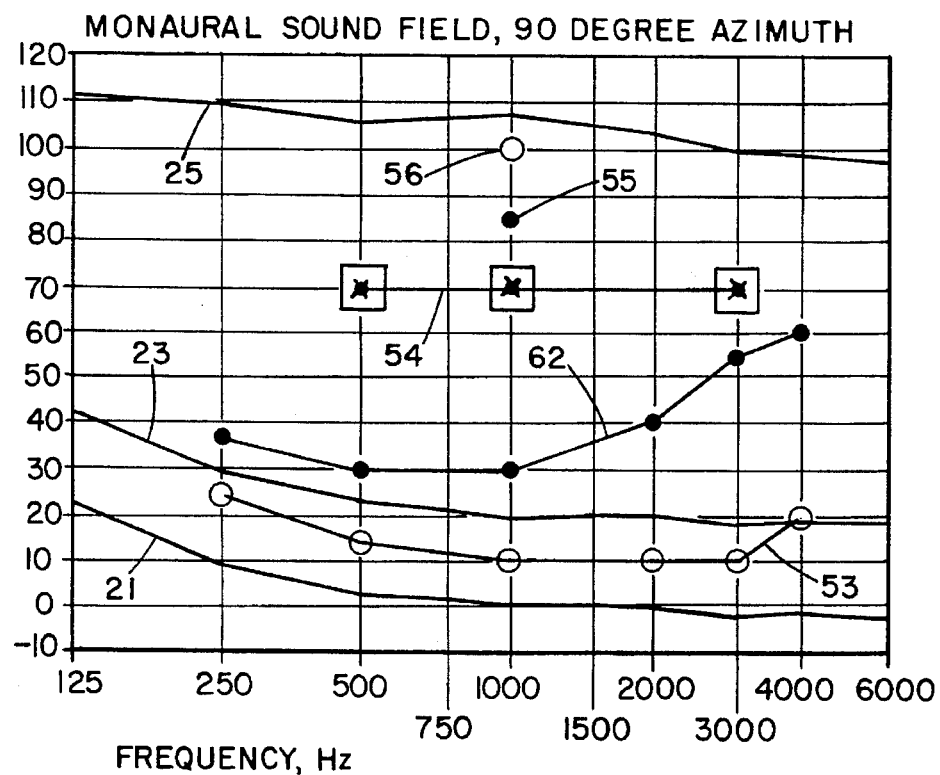
FIG. 12 is an example of a Sound Pressure Level Complex Audiogram of an individual with moderately severe hearing loss at high frequencies showing unaided measurements and theoretical aided measurements.

FIG. 2 is an audiogram which illustrates the key features of normal hearing. This "Sound Pressure Level Complex Audiogram", so called because the measurements are all referenced to Sound Pressure Level, is used to indicate the dynamic range of hearing as a function of frequency, rather than only hearing thresholds as on common audiograms. The SPL Complex Audiogram is of significant value in comparing the hearing of an individual before and after fitting with a hearing aid. All measurements are performed under sound field conditions, without the use of headphones or the like. The sound radiator or speaker is placed at a 90° angle to the head such that the sound is emitted directly into either the left or the right ear. As is commonly practiced, either masking noise is introduced into the ear which is not being tested or the ear not being tested is occluded to ensure that measurements truly reflect the performance of the ear being tested. Normal thresholds of sensitivity and discomfort are indicated and serve as reference curves in the following discussion of exemplary audiograms of hearing impaired individuals who may benefit from the invention. These exemplary audiograms are shown in FIGS. 11 and 12. The thresholds of sensitivity for the best hearing, curve 21, which is also referred to as 0 dB Hearing Level, is indicated. The upper limit of normal hearing sensitivity thresholds is shown as curve 23, which is elevated with respect to curve 21 by 20 dB; any thresholds of lesser SPL than indicated by curve 23 are considered normal.

Still referring to FIG. 2, the Preferred Listening Level or PLL for normal hearing individuals is at approximately 70 dB SPL. Line 24 represents a loudness balance test at PLL. The four points shown on line 24 represent pure tone sounds which are perceived equally loud by normal hearing individuals; in other words the perceived loudness of a 500 Hz pure tone presented at 70 dB SPL is the same as the perceived loudness of a 1000 Hz pure tone at 70 dB SPL, and is also the same as the perceived loudness of either a 2000 Hz or 3000 Hz pure tone at 70 dB SPL. Normal thresholds of discomfort are indicated by curve 25. To significantly enhance speech intelligibility for the hearing impaired user, the present invention corrects abnormal thresholds of sensitivity while not violating the user's thresholds of discomfort. In a preferred embodiment, the signal processing provides the proper frequency-dependent gain for low level inputs near the threshold of hearing in order to correct frequency-dependent variations from normal thresholds. Additionally, the system automatically alters its frequency response for higher level input signals as necessary to provide normal responses at PLL, as well as at the threshold of discomfort.

When a Sound Pressure Level Complex Audiogram is employed to record an individual's hearing, instrumentation is utilized to produce pure tones in sound field at various sound pressure levels throughout the dynamic range of normal hearing and with a typical resolution of 5 dB. Therefore, measurements of one's thresholds of sensitivity or discomfort or loudness balance test results may be in error by a small amount depending on the exact procedure used by the tester. Further, it is preferable for a hearing professional to have a means for determining an individual's Preferred Listening Level for speech, such as an instrument that can generate speech in sound field at calibrated Sound Pressure Levels.

Figure 4:
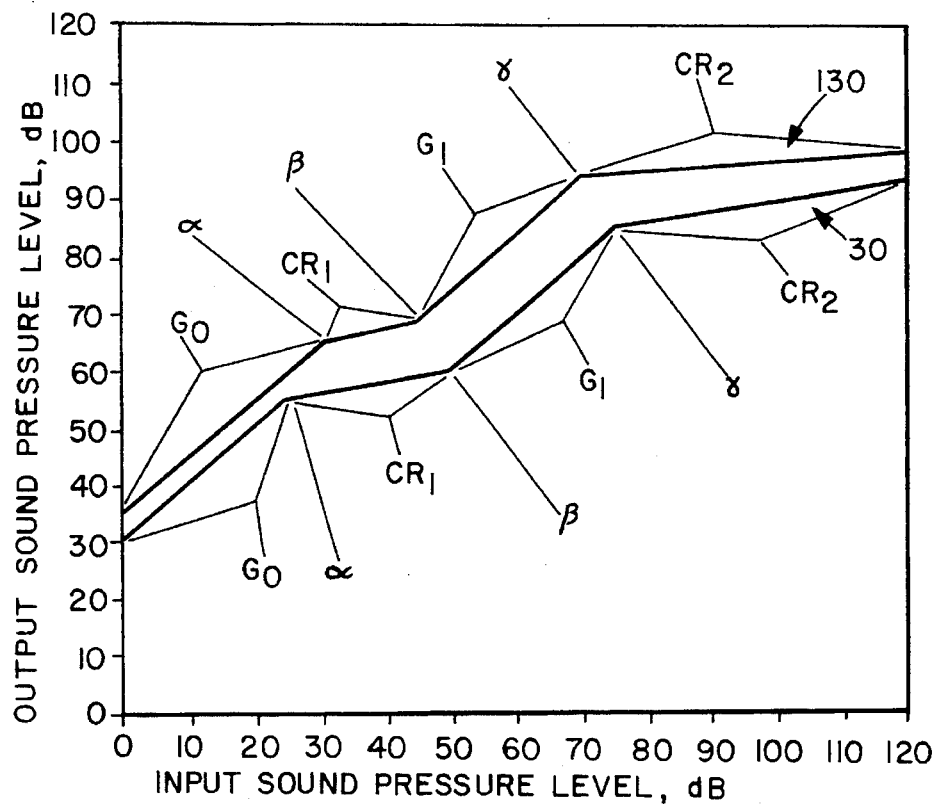
FIG. 4 illustrates the compression curve at a particular frequency for two idealized multi-level compression devices.

FIG. 4 depicts two idealized compression curves 30 and 130 of devices designed according to the invention. Acoustic output level in decibels SPL is plotted as a function of acoustic input level in decibels SPL. The significant features of these compression curves are 1) the location of the first compressor lower bound or first knee, $\alpha$; 2) the location of the first compressor upper bound, $\beta$; 3) the location of the second compressor lower bound or second knee, $\gamma$; 4) the system gain in the linear region of amplification below the first knee $\alpha$, designated as $G_0$; 5) the average compression ratio applicable to the region between $\alpha$ and $\beta$, designated as $CR_1$; 6) the system gain in the linear region of amplification between $\beta$ and $\gamma$, designated as $G_1$; and 7) the average compression ratio applicable to the region above the second knee $\gamma$, designated as $CR_2$. In the case of curve 30, $\alpha$=25 dB input SPL, $\beta$=50 db input SPL, $\gamma$=75 dB input SPL, $G_0$=30 dB, $G_1$=10 dB, $CR_1$=5, and $CR_2$=5. In the case of curve 130, $\alpha$=30 dB input SPL, $\beta$=45 db input SPL, $\gamma$=70 dB input SPL, $G_0$=35 dB, $G_1$=23.75 dB, $CR_1$=4, and $CR_2$=10.

In a preferred embodiment of the present invention, a first level detector in conjunction with an electronically-controllable amplifier block operates at input levels greater than $\alpha$ and less than $\beta$ to compress the dynamic range of the input signal. The input sound pressure level at which the first compressor action begins, $\alpha$, is selected to be at an input level typically equal to or less than 30 dB SPL, and $\beta$, defined as the input sound pressure level at which the first compressor action ceases, is set at a level which depends on the user's hearing level. Typically, $\beta$ is chosen to be between 0 dB and 10 dB above the user's average threshold of sensitivity, for example, at 50 dB input SPL. Thus, under usual circumstances and at Preferred Listening Level, the sound pressure level of most of the phonemic elements of speech is greater than $\beta$. Extra gain, not present for inputs greater than $\beta$, is provided for low level input signals. Additionally, a second level detector in conjunction with an electronically-controllable attenuator block operates at input levels greater than $\gamma$, selected to typically be around 75 dB SPL. Two linear regions of amplification are thereby provided, the first for input signals of amplitude less than $\alpha$, and the second for input signals of amplitude between $\beta$ and $\gamma$. This second linear region typically encompasses the user's Preferred Listening Level. The gain $G_0$ in the linear region below $\alpha$ is always greater than the gain $G_1$ in the linear region between $\beta$ and $\gamma$. This reduction in system gain provides several important benefits to the hearing-impaired user as will be clarified below.

TABLE 1

| Input, dB SPL | | Output, dB SPL |
|---|---|---|
| 20 | | 50 |
| 25 | ($\alpha$) | 55 |
| 30 | | 56 |
| 40 | | 58 |
| 45 | | 59 |
| 50 | ($\beta$) | 60 |
| 60 | | 70 |
| 70 | | 80 |
| 75 | ($\gamma$) | 85 |
| 80 | | 86 |
| 90 | | 88 |
| 100 | | 90 |
| 110 | | 92 |
| 120 | | 94 |

Table 1 is representative of curve 30 of FIG. 4. Because the output level for curve 30 in the region between $\alpha$ and $\beta$ rises 5 dB for an input change of 25 dB, $CR_1$ is 25/5 or 5. Similarly for curve 130, $CR_1$ is 4. A unique aspect of multi-level compression provided by this invention is that there are two regions of compression, one for lower level input signals ($CR_1$) and the other for high level input signals ($CR_2$), with the average compression ratio in the low level region selected to typically be between 2 and 6 and the average compression ratio in the high level region selected to typically be between 4 and 10. The second compression region $CR_2$ begins at $\gamma$ and extends throughout the range of input signals above $\gamma$. Specifically, $CR_2$ is equal to 5 in the case of curve 30 and, in the case of curve 130, is equal to 10.

The gain below the first knee $\alpha$ is selected to provide the hearing impaired user with normal or near normal thresholds of hearing sensitivity. However, the gain required to provide normal thresholds is generally greater than appropriate at Preferred Listening Level (PLL). The compression region between $\alpha$ and $\beta$ has the effect of reducing the system's gain to an appropriate value for input signals in the range from $\beta$ to $\gamma$, designed to encompass the user's PLL. Although the amplification provided by the invention for signals near the user's PLL is linear and the device minimally processes those sounds that the user has no difficulty hearing, the louder phonemes of speech may be at a sound pressure level greater than the second knee $\gamma$. The compression action above the second knee prevents loud phonemes, as well as other incoming sounds louder than $\gamma$, from causing discomfort. This multiple compression scheme is intended to ensure that all incoming sounds are processed to fall within the user's dynamic range of hearing, while at the same time providing normal or near normal thresholds of hearing.

The benefit of multi-level compression in the presence of noise is also illustrated by curve 30 and Table 1. We again consider the performance when fitted to an individual with a threshold of sensitivity of 50 dB. The typical background noise level of 50 dB is highlighted. This specific embodiment of the invention will present the room noise at a level of 60 dB. Consider again the word "ball", with the \ó\ 17 at a level of 75 dB SPL and the \b\ 14 at a level near 56 dB SPL. The system described by Table 1 presents the \b\ to the user at 66 dB, which is 6 dB above the background noise. Significantly, this improved ability to understand speech in noise is provided by this invention without compromising threshold sensitivity: in the case illustrated in Table 1, the 30 dB of gain provided at the lowest input signal levels fully corrects threshold responses.

It is important to note that the loudness control setting of a hearing aid of the present invention can be comfortably set to a higher level than that of a hearing aid with linear amplification, providing better understanding of speech without violation of the threshold of discomfort. In the case shown in Table 1, usual speech is presented to the user at about 80 db, yet better threshold performance and better ability to understand speech in noise are both attained by the invention.

Figure 6A:
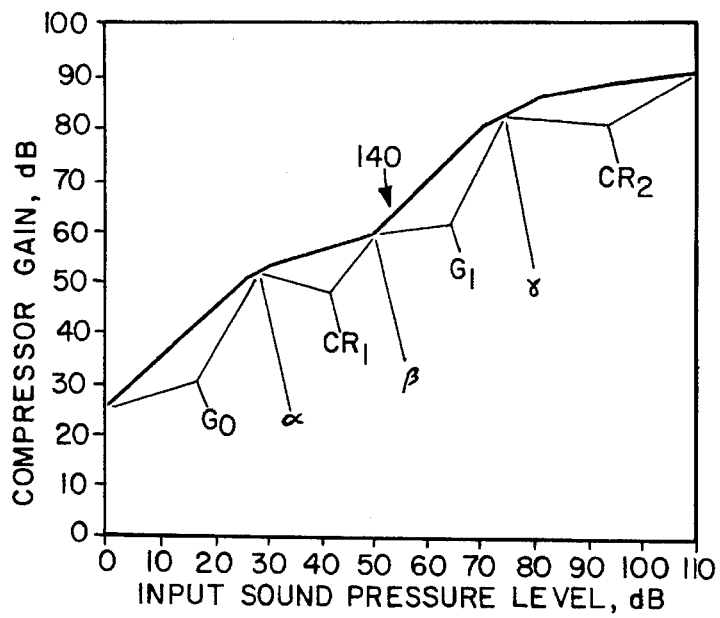
FIG. 6A illustrates the compression curve of the embodiment of FIG. 5.
Figure 10A:
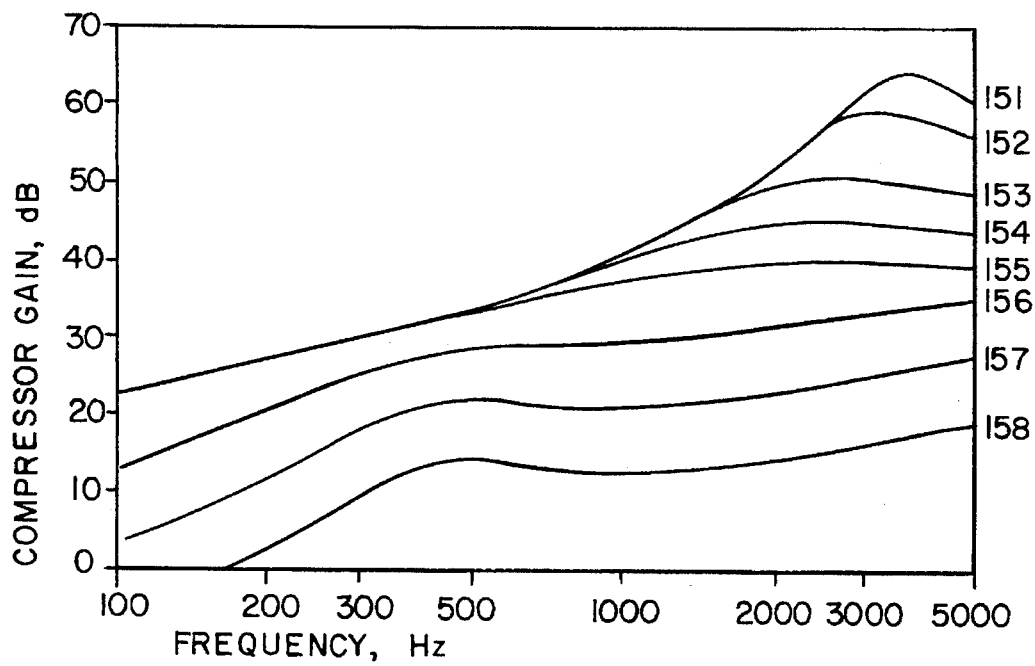
FIG. 10A illustrates the compressor frequency response of the embodiment of FIG. 9 at eight different input sound pressure levels.
Figure 10B:
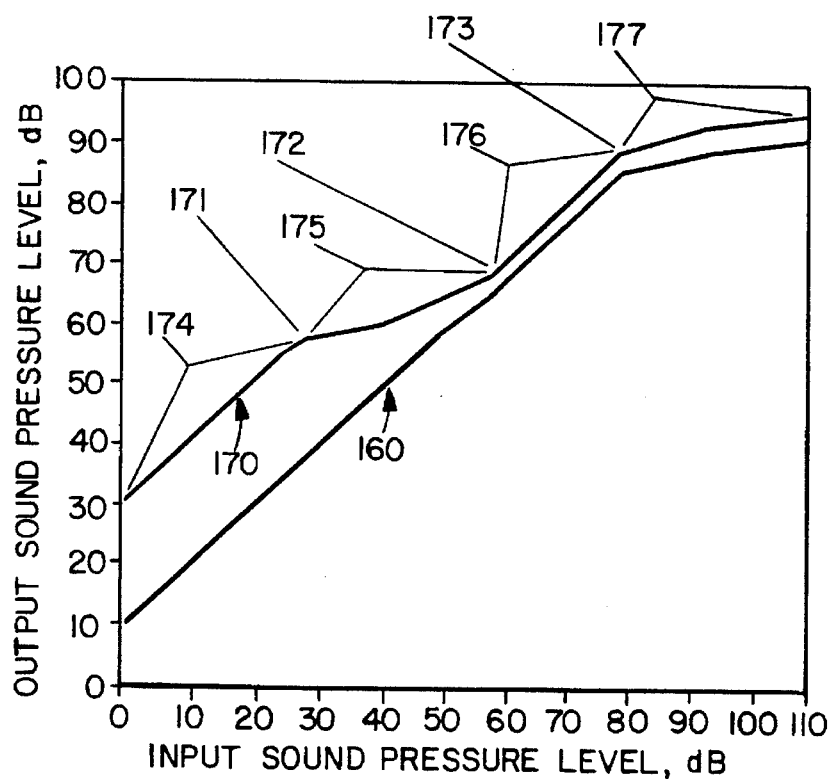
FIG. 10B illustrates the compression curves at both 1000 Hz and 3000 Hz of the embodiment of FIG. 9.

The compression curves 30 and 130 of FIG. 4 are idealized and are shown as perfectly straight line segments, however, such idealized curves are not a requirement for successful operation of the invention. FIGS. 6A and 10B, described in detail below, illustrate compression functions of actual embodiments of the invention.

A speech enhancement system of the present invention incorporates compression circuitry which processes individual phonemic elements of speech in a manner which adjusts the interphonemic amplitude relationships. For example, consider a system having the input/output relationship shown in FIG. 4 curve 30 processing the word "ball" presented at a level consistent with FIG. 1. Referring to FIG. 1, the phoneme \b\ 14 has two general spectral regions, one with a lower frequency component around 350 Hz and the other with a higher frequency component around 2500 Hz. The low frequency energy is shown in FIG. 1 as having an amplitude of 67 dB SPL and the high frequency component is at about 66 dB SPL. The combined energy of the phoneme \b\ in this case will be about 69.5 dB SPL and thus the input level is greater than both $\alpha$ and $\beta$, but less than $\gamma$. Assuming that the input/output curve 30 applies to both 350 Hz and 2500 Hz and noting that the acoustic gain $G_1$ of this particular system for signals in the linear region is 10 dB, the phoneme \b\ at the output of the device will have a low frequency component at a level of about 77 dB SPL and a high frequency component at about 76 dB SPL, for a total level of about 79.5 dB. In contrast, the louder vowel \ó\ 17, at an input level of 85 dB SPL, is above the second knee $\gamma$, and when processed, the system compresses ($CR_2$=5), presenting the vowel to the user at a level of 87 dB SPL. The final \l\ also contains two spectral regions. The lower frequency energy around 350 Hz is at a level of about 77 dB SPL at the device input and the higher frequency energy around 2000 Hz is at a level of about 76 dB SPL at the device input. The total energy of the \l\ is therefore approximately 79.5 dB SPL and at this level the device also exhibits a compression ratio of 5. For an input level of 79.5 dB SPL, according to curve 30, the acoustic output of the system will be about 85.9 dB SPL and the acoustic gain is about 6.4 dB. Consequently, to the user of the invention, the \l\ will contain a low frequency component at about 77 dB SPL+6.4 dB gain or 83.4 dB SPL and a higher frequency component at 76 dB SPL+6.4 dB gain or 82.4 dB SPL. In this example it can be seen that the amplitude relationships between the individual phonemes of the word have been altered by the speech processing system.

The speech enhancement system must have rapid attack and recovery times for optimum processing of individual phonemes of speech. In order to specify an appropriate range of attack and recovery times for the present invention, we must consider the duration of the individual phonemes of speech which we desire to process, as well as the requirement of processing the sound with minimal distortion. It is well known that if a compressor's attack and recovery time is too rapid, the system will cause harmonic distortion. Assume that the attack and recovery times for both level detectors 73 and 74 are identical. The sum of the attack time, designated here as $\tau_A$, and the recovery time, designated here as $\tau_R$, must be longer than about 3 periods of the lowest frequency amplified by the system so that the compressor action responds to the envelope rather than the instantaneous waveform. Thus $\tau_A$ plus $\tau_R$ must be greater than 30 milliseconds in a system designed to process frequencies as low as 100 Hz. On the other hand, the response of the compressor must be rapid enough to process individual phonemes in as complete a manner as possible. These conditions lead to a specification of attack time between 1 and 20 milliseconds and a specification of recovery time between 20 and 200 milliseconds. In the present invention, typical attack time $\tau_A$ is less than 10 milliseconds and typical recovery time $\tau_R$ is between 75 to 150 milliseconds. This very short attack and short recovery enables the speech enhancement system to adequately handle rapidly changing dynamic conditions such as a trailing consonant after a loud vowel without introducing significant amplitude distortion. When attack and recovery times lengthen, a compressor cannot process individual phonemes, although individual syllables may by processed. So-called "syllabic compressors" do not, however, adjust the interphonemic loudness relationships as in the present invention to compensate for hearing impairment.

The simplest means for measuring compressor characteristics (to generate curves such as 30 and 130 in FIG. 4) for the present invention is to provide a single frequency, for example 1 KHz, to the device at various sound pressure levels and measure the resulting output level. Alternatively, a compression curve may be generated by presenting a speech noise signal to the device at various sound pressure levels, measuring the sound pressure level at the output, and computing the difference. Because the present invention may exhibit compression characteristics dependent upon frequency, a compression curve such as 30 of FIG. 4 may apply to either a narrow or broad range of frequencies.

Figure 13:
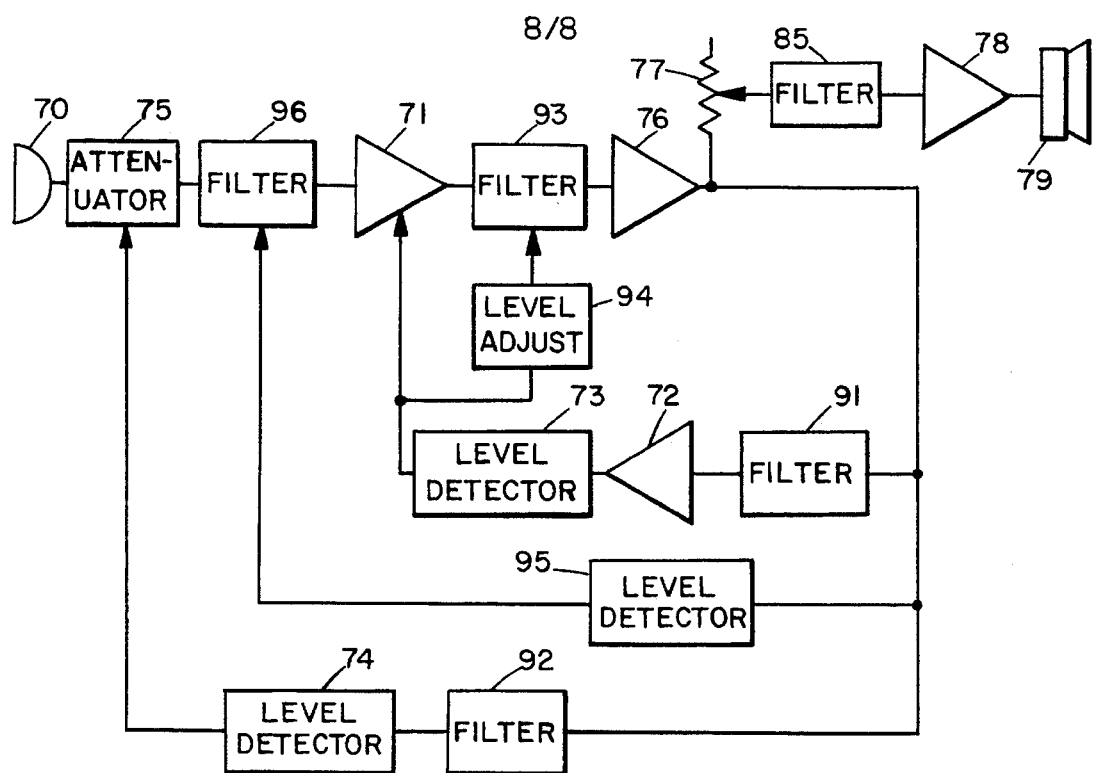
FIG. 13 is a block diagram of a fifth embodiment of the speech enhancement system including electronically-controllable filters and multi-level compression.

In one variation, the compression function parameters $\alpha, \beta, \gamma, CR_1$ and $CR_2$ are identical across a broad range of frequencies (such as in FIG. 6B), however the gain of the system varies with frequency for all input levels due to the action of a non-adaptive filter 85 with fixed frequency response placed after the volume control, as shown in FIG. 13. In this manner, certain forms of frequency-dependent hearing loss can be significantly corrected; however no adaptive filtering is provided. In another variation, the action of a filter 91 (FIG. 13) which precedes a level detector causes the knee of the compressor to vary as a function of frequency. A hearing aid designed according to this embodiment could, for example, provide a compression knee for predominantly high frequency phonemes such as \th\ 11 or \f\ 12 which is at a higher input sound pressure level than the compression knee provided for phonemes without significant high frequency energy such as \l\ 15 or \o\ 17. In yet another embodiment, the configuration of the electronically-controllable amplifier block is such that its frequency response varies as its gain varies, and the adaptive filtering thereby provided alters the frequency response of the device as a function of input level. Similarly, the electronically-controllable attenuator may also be designed to vary its frequency response as its transmission varies. In still another variation (see FIG. 13), an additional level detector, independent of the two which control the gain, alters the characteristics of an electronically-controllable filter block. In this case both the frequency response and acoustic gain of the device as a function of the input signal are varied in an extremely flexible manner.

Figure 5:
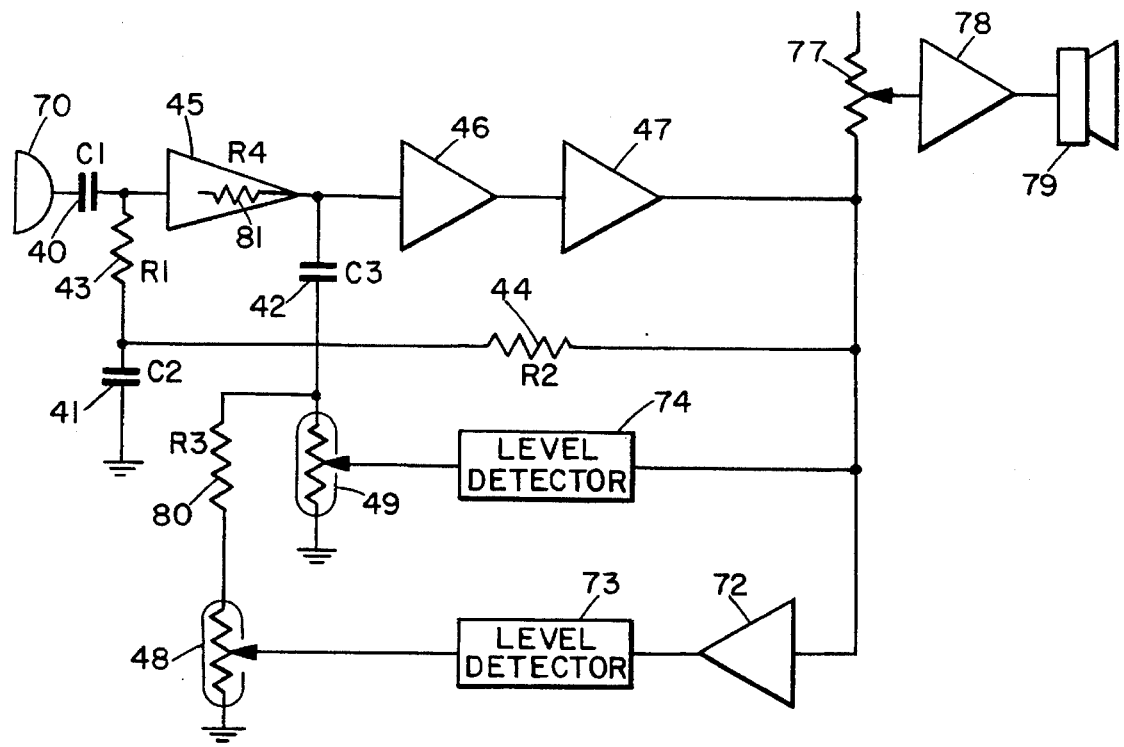
FIG. 5 is a block diagram of a second embodiment of the invention incorporating multi-level compression.
Figure 8:
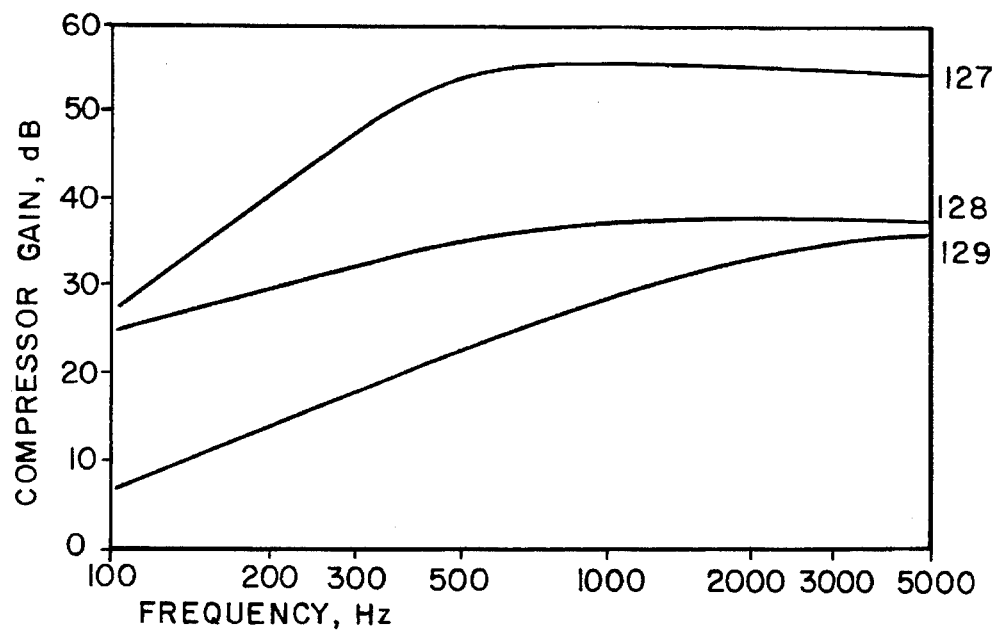
FIG. 8 illustrates the compressor frequency response of the embodiment of FIG. 7 at three different input sound pressure levels.
Figure 6B:
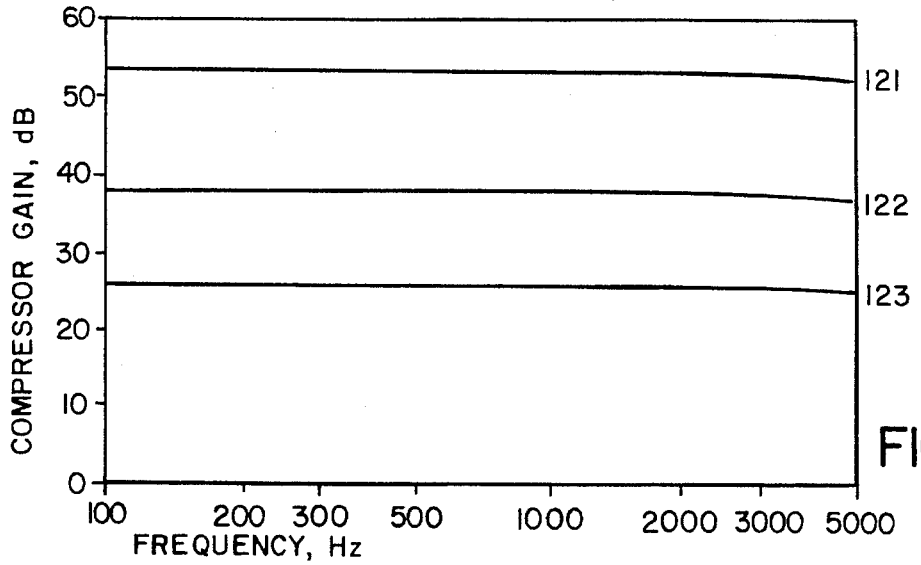
FIG. 6B illustrates the compressor frequency response at three different input sound pressure levels of the embodiment of FIG. 5 without adaptive filtering.
Figure 6C:
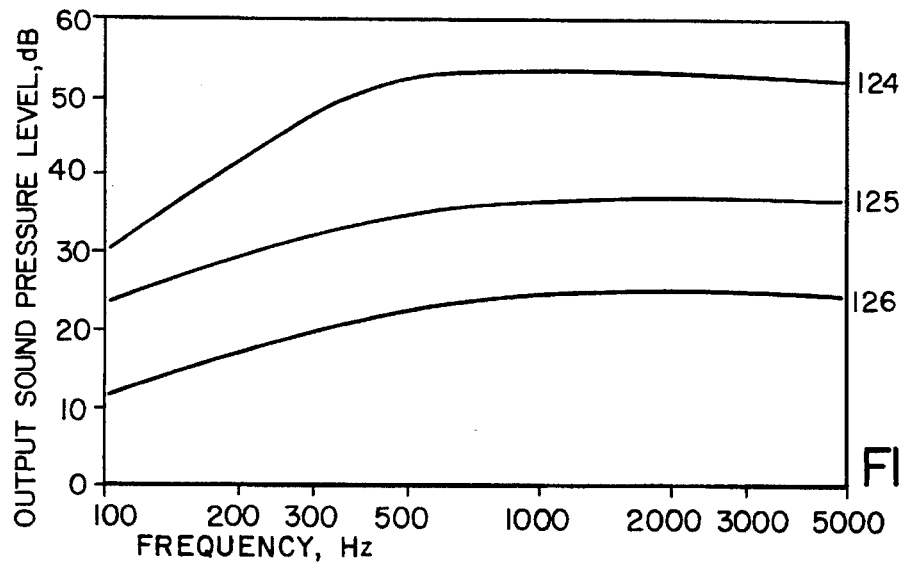
FIG. 6C illustrates the compressor frequency response at three different input sound pressure levels of the embodiment of FIG. 5 with adaptive filtering.
Figure 7:
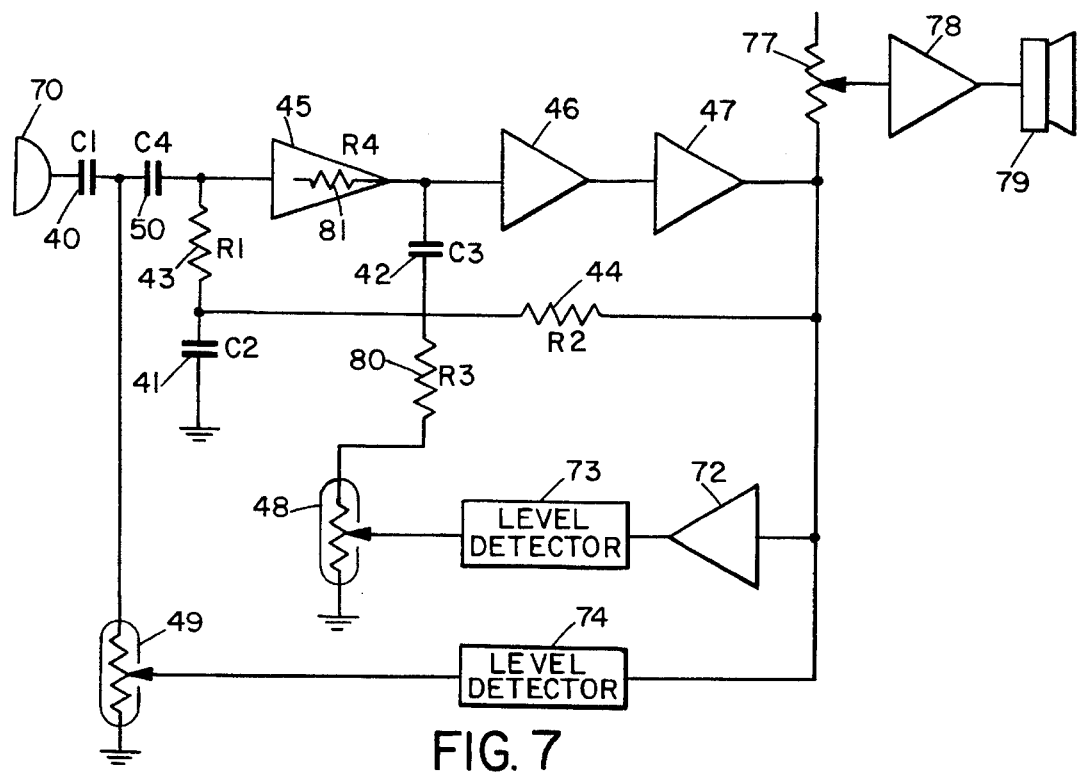
FIG. 7 is a block diagram of a third embodiment which incorporates multi-level compression.
Figure 9:
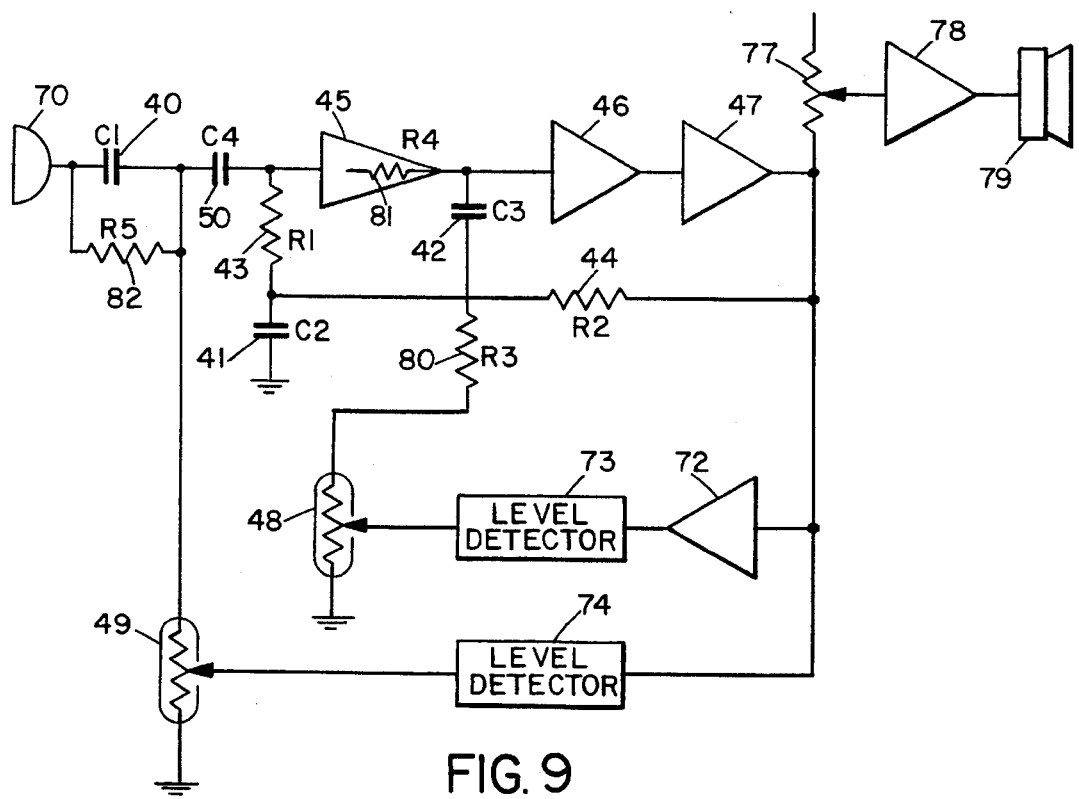
FIG. 9 is a block diagram of a fourth embodiment with adaptive high frequency emphasis and multi-level compression.

FIGS. 5 through 10 and FIG. 13 illustrate a variety of alternative embodiments. FIGS. 5, 7 and 9 are block diagrams of three embodiments of the invention which show details of the electronically-controllable gain blocks and which utilize voltage-controlled resistances 48 and 49 to vary gain and filter characteristics. Suitable voltage-controlled resistors can be constructed either from a field-effect transistor or a bipolar transistor. Various voltage-controlled resistor designs have been documented in the literature, including, for example, Killion (U.S. Pat. No. 4,170,720) which incorporates a bipolar transistor configured as a voltage-controlled resistance. For all of the embodiments, the functions of the amplifier/limiter 72 and of the first and second level detectors, 73 and 74, are as explained above with reference to FIG. 3. Circuit details of the level detectors, 73 and 74, the amplifier/limiter 72, the voltage-controlled resistors 48 and 49, and the power amplifier 78 are not shown, as designs for these elements are well known by those skilled in the art.

Each of the three embodiments of FIGS. 5, 7, and 9, respectively, includes three amplification stages 45, 46 and 47, which together comprise an electronically-controllable amplifier block. Details concerning the DC bias of the three amplification stages are not shown as these are well known in the field. The voltage gain of the power amplifier 78, common to all of the embodiments, remains fixed at all signal levels, typically about 5. Overall system acoustic gain for all of the embodiments is determined by the sensitivity of the microphone or other acoustic input device 70, the compressor gain, which varies as a function of the input signal, the setting of the loudness control 77, the gain of the power amplifier 78, and the sensitivity of the acoustic output device or receiver 79. Typically, the sensitivity of a hearing aid microphone is such that an acoustic input of 70 dB SPL results in an electrical output of about 1 mV RMS; and the typical sensitivity of a hearing aid receiver is such that 70 dB of acoustic output results for an input of about 6 mV RMS. Mathematical analysis of the circuits shown in FIGS. 5, 7 and 9 will yield frequency responses and compression curves very similar to the measured responses illustrated in FIGS. 6A, 6B, 6C, 8, 10A, and 10B.

FIGS. 6A and 10B illustrate compression curves for the second and fourth embodiments shown in FIGS. 5 and 9, respectively, with FIG. 10B including measurements at both 1000 Hz and 3000 Hz. The measurements of FIGS. 6A were obtained with a particular typical loudness control setting, and greater or lesser acoustic output levels would result at higher or lower settings. Similarly, FIG. 10B incorporates measurements made with a particular typical loudness control setting. With reference to FIGS. 5 through 10, the term "compressor gain" refers to the voltage gain exhibited from the output of the microphone or other acoustic input device 70 to the output of the third amplification stage 47. FIGS. 6B and 6C both depict compressor gain as a function of frequency for the second embodiment illustrated in FIG. 5, although with two different choices of component values. FIG. 6B shows very flat frequency response at three input Sound Pressure Levels, 25 dB, 70 dB, and 90 dB, for a system with no adaptive filtering; and FIG. 6C shows curves at the same three input levels for a system exhibiting adaptive low frequency roll-off. FIG. 8 illustrates compressor gain at 25 dB, 70 db and 90 dB input Sound Pressure Levels as a function of frequency for the third embodiment of FIG. 7. These three levels are chosen to clarify operation of the embodiment at input levels less than $\alpha$, input levels greater than $\beta$ but less than $\gamma$, and input levels greater than $\gamma$. FIG. 10A shows compressor gain as a function of frequency at eight different input Sound Pressure Levels, from 25 dB to 110 dB, to illustrate the detailed effect of adaptive filtering in the fourth embodiment of FIG. 9.

Measurement of the adaptive frequency responses of systems designed according to this invention involves careful technique. One method is to introduce a wideband noise signal, such as noise shaped to include the average spectral energy of speech, at the input of the system at various sound pressure levels and measure the spectrum of the output noise. The difference in amplitude between the output and input spectra at various frequencies and at various input sound pressure levels can then be noted. Were the tester to utilize swept pure tone signals at the system input, the responses would differ significantly from those shown in FIGS. 6C, 8 and 10A because the compressor action of the invention will generally vary as the input frequency is swept. Because we are interested in how speech will be processed by the device, the response to speech noise better characterizes the system behavior. Another approach is to add a low-level test tone to an input speech noise signal and measure the test tone level at the output. In this case, the speech noise can be considered a conditioning signal to the system in that it establishes the compressor gain and frequency response which then acts on the test tone.

FIG. 5 is a block diagram of a second embodiment which incorporates two voltage-controlled resistors (VCR), 48 and 49, to achieve multi-level compression. In this embodiment, VCR's 48 and 49 interact with the electronically-controllable amplifier block comprised of amplification stages 45, 46 and 47 to provide the desired response. Each of the amplifier stages 45 through 47 preferably consists of a single transistor, and R4 81 represents the output impedance of stage 45. Because each amplifier stage inverts the phase of the audio signal, resistor R2 44, capacitor C2 41, and resistor R1 43 supply negative feedback for the amplifier. Component values are selected to exhibit virtually flat frequency response or can be made to exhibit low frequency roll-off which varies as a function of input signal level. Table 2 shows component values and amplification stage gains for the embodiment of FIG. 5 with flat frequency response.

TABLE 2

| Component | Designation | Value/Gain |
| --- | --- | --- |
| amp stage 1 | 45 | 10 |
| amp stage 2 | 46 | 10 |
| amp stage 3 | 47 | 5 |
| capacitor C1 | 40 | 0.47 µF |
| capacitor C2 | 41 | 0.47 µF |
| capacitor C3 | 42 | 2.2 µF |
| resistor R1 | 43 | 150K Ω |
| resistor R2 | 44 | 10M Ω |
| resistor R3 | 80 | 68k Ω |
| resistor R4 | 81 | 370k Ω |

Typically, with the amplification stage gains shown in Table 2, the maximum open-loop gain of the three cascaded stages 45, 46 and 47 shown in FIG. 5 is 500 or about 54 db. When the input signal level is low, both VCR's 48 and 49 are of high resistance and the gain of the system is maximum. As the input signal level increases, the system gain remains unchanged until the input signal level reaches the first compressor lower bound α. Although α is at a low level, the amplifying action of amplifier 72, with a typical gain of 26 dB, enables detector 73 to respond, and the output voltage of the first level detector 73 causes the resistance of the first voltage-controlled resistor 48 to decrease and affect the gain of the system. The capacitor C3 is of a large value, 2.2 µF typically, such that its impedance is low in comparison to R4 81 and R3 80 at audio frequencies. Thus, the signal at the output of amplifier 45 is attenuated throughout the audio spectrum of interest by the voltage divider formed by R4 81 and resistors 80, 48 and 49. As the input signal further increases in amplitude, resistance 48 further decreases until the input signal equals the first compressor upper bound β. At this point the resistance of VCR 48 is approximately 500Ω. Both the limiting action of amplifier 72 and the presence of the R3 80 in series with VCR 48 prevent the first level detector 73 from causing further gain reduction when the input signal level is greater than β. When the input signal amplitude is greater than β and less than γ, the system amplifies linearly with an overall acoustic gain of $G_1$. For input signal levels greater than the second compressor lower bound γ, the second level detector 74 causes the second voltage-controlled resistor 49 to decrease and thereby further reduce system gain. When the input signal is about 90 db SPL, the resistance of VCR 49 is about 19 KΩ, and for larger input signals, VCR 49 further decreases in resistance.

FIG. 6A illustrates the compression curve 140 for the second embodiment shown in FIG. 5. For the component choices of Table 2, this curve applies to a wide range of frequencies, from below 250 Hz to above 4000 Hz. The gain $G_0$ in the linear region for low input signal levels is 25 dB, and this region ends at α which is at about 27 dB input SPL. Between α and β, there is a region of compression where the average compression ratio $CR_1$ is approximately 3.3. For input levels greater than β and less than γ, a second region of linear amplification exists, where the gain $G_1$ is about 9.5 dB. As can be seen from FIG. 6A, the difference between $G_0$ and $G_1$ is about 17.5 dB. Beyond γ, which is at approximately 75 dB input SPL, there is a second region of compression. For high level input signals, the average compression ratio $CR_2$ is about 4.5. Frequency response curves 121, 122 and 123, shown in FIG. 6B, represent the compressor gain for the embodiment of FIG. 5/Table 2 at 25 dB, 70 dB and 90 dB input Sound Pressure Level, respectively.

To further clarify operation of the invention, Table 3, below, shows the relationship between the acoustic input sound pressure level (column "InLevel") and the microphone output signal level (column "MicOut"), compressor gain at 1 KHz (column "ComprGain"), and resistances 48 and 49 (columns "VCR48" and "VCR49") illustrated in FIG. 5. Also tabulated is the acoustic output level (column "OutLevel") and acoustic gain of the embodiment of FIG. 5, with the loudness control adjusted corresponding to FIG. 6A. Finally, as an aid to better understanding the necessary behavior in this embodiment of the level detectors 73 and 74 in conjunction with the voltage-controlled resistors 48 and 49, the AC voltage levels at the inputs of both the level detectors (columns "Detect1In" and "Detect2In" are also shown in Table 3.

TABLE 3

| InLevel db SPL | MicOut AC volts | ComprGain @ 1KHz, dB | Detect1In AC volts | VCR48 Ω | Detect2In AC volts | VCR49 Ω | OutLevel dB SPL | AcousticGain dB |
| --- | --- | --- | --- | --- | --- | --- | --- | --- |
| 25 (α) | 5.62 µV | 53.3 | 51.9 mV | 10M | 2.60 mV | 10M | 50.0 | +25.0 |
| 30 | 10.0 µV | 51.1 | 71.6 mV | 1M | 3.59 mV | 10M | 52.8 | +22.8 |
| 40 | 31.6 µV | 44.4 | 105 mV | 120K | 5.24 mV | 10M | 56.1 | +16.1 |

TABLE 3-continued

| InLevel db SPL | MicOut AC volts | ComprGain @ 1KHz, dB | Detect1In AC volts | VCR48 Ω | Detect2In AC volts | VCR49 Ω | OutLevel dB SPL | AcousticGain dB |
|---|---|---|---|---|---|---|---|---|
| 50 (β) | 100 μV | 37.8 | 155 mV | 500 | 7.76 mV | 10M | 59.5 | +9.5 |
| 60 | 316 μV | 37.8 | 160 mV | 450 | 24.5 mV | 10M | 69.5 | +9.5 |
| 70 (γ) | 1.00 mV | 37.8 | 160 mV | 450 | 77.6 mV | 9.5M | 79.5 | +9.5 |
| 80 | 3.16 mV | 33.5 | 160 mV | 450 | 150 mV | 90K | 85.2 | +5.2 |
| 90 | 10.0 mV | 25.7 | 160 mV | 450 | 193 mV | 19K | 87.4 | −2.6 |
| 100 | 31.6 mV | 17.2 | 160 mV | 450 | 229 mV | 5.9K | 88.9 | −11.1 |
| 110 | 100 mV | 8.3 | 160 mV | 450 | 260 mV | 2.0K | 90.0 | −20.0 |

The second embodiment, illustrated in FIG. 5, incorporates a hearing aid microphone with 1 mV output at 70 db SPL input and a loudness control setting such that 70 dB SPL acoustic input produces 79.5 dB SPL acoustic output. The action of amplifier/limiter 72 is illustrated by comparing the "Detect1In" column with the "Detect2In" column. The input voltage to the second level detector 74 is also the input voltage to 72, and the input voltage to the first level detector 73 is also the output voltage of 72. As shown in Table 5, 72 saturates at about 10 mV input and never outputs greater than 160 mv output. The required characteristic of level detector 73 operating in conjunction with voltage-controlled resistor 48 is therefore apparent: at 52 mV input to the detector 73, the resistance of VCR 48 just begins to decrease from its maximum value of 10 MΩ; at 105 mV input to level detector 73, the resistance of VCR 48 is reduced to 120 KΩ, and at 155 mV input it is further reduced to only 500Ω. The table shows that the amplifier/limiter 72 prevents the input to the level detector 73 from increasing beyond 160 mV. Similarly, level detector 74 operating in conjunction with voltage-controlled resistor 49 can be evaluated from the table. When the input voltage to level detector 74 is less than about 75 mV, the resistance of VCR 49 remains at its maximum value of 10 MΩ; and as the input to level detector 74 increases, the resistance of VCR 49 decreases as shown. In this embodiment, VCR 49 remains at its maximum value for input voltages to detector 74 of less than about 75 mV.

Changing the component values capacitors C1 40 and C2 41 to 2200 pF and 0.022 μF, respectively, causes the compressor frequency response curves to appear as in FIG. 6C. This low frequency roll-off is due to two factors: 1) the impedance of C1 40, which is independent of the compressor gain, and the affect of C2 41, which varies with the compressor gain. Curve 124, measured at 25 dB input SPL, shows greater roll-off than either curve 125, measured at 70 db input SPL, or curve 126, measured at 90 dB input SPL. As the input sound pressure levels increases from α to β the open-loop gain of the three-stage amplifier 45, 46 and 47, decreases from 500 (54 dB) to about 78 (37.9 db) and this reduces the influence of capacitor C2 41 in the feedback path, effectively changing the 12 dB/octave roll-off of curve 124 to the 6 dB/octave roll-off of curves 125 and 126. This embodiment of the invention is meant to assist those with relatively flat hearing losses. The roll-off of low frequencies prevents room noise, which is predominantly low frequency energy, from causing inappropriate variations in system gain, often heard as a fluttering sound.

FIG. 7 illustrates a third embodiment in which the frequency response of the system is significantly influenced as input level changes. The interaction between the amplifying stages 45, 46 and 47 and voltage-controlled resistor 48 is similar to the second embodiment of FIG. 5. This embodiment differs, however, in that the second detector 74 controls a resistance 49 which bypasses the input signal at the junction of capacitors C1 40 and C4 50. This electronic attenuation of the input signal is in contrast to the action of the second detector 74 and voltage-controlled resistor 49 in FIG. 5 which cause further reduction of the gain of the amplifying section. Thus, in the third embodiment, high level input signals are attenuated before, rather than after, the first stage of amplification 45. This prevents saturation of the input transistor, and the associated unwanted distortion, in circumstances where there are extremely loud sounds. In embodiments which include electronic attenuation of the input signal, the dynamic range of input signals which can be processed with low distortion is greatly enhanced. This embodiment, and the fourth embodiment shown in FIG. 9, both exhibit distortion less than 10% for inputs at 120 db SPL and less than 15% for inputs at 130 dB SPL. Table 6 shows typical component values and amplification stage gains for the third embodiment. Again, R4 81 represents the output impedance of amp stage 45.

TABLE 4

| Component | Designation | Value/Gain |
|---|---|---|
| amp stage 1 | 45 | 10 |
| amp stage 2 | 46 | 10 |
| amp stage 3 | 47 | 6 |
| capacitor C1 | 40 | 1000 pF |
| capacitor C2 | 41 | 0.022 μF |
| capacitor C3 | 42 | 0. μF |
| capacitor C4 | 50 | 2200 pF |
| resistor R1 | 43 | 390K Ω |
| resistor R2 | 44 | 10M Ω |
| resistor R3 | 80 | 33K Ω |
| resistor R4 | 81 | 200K Ω |

As in the second embodiment, the third embodiment has resistor R2 44, capacitor C2 41, and resistor R1 43, to supply negative feedback for the amplifier. With the typical amplification stage gains shown in Table 4, the maximum open-loop gain of the three cascaded stages 45, 46 and 47 is 600 or about 56 db. When the input signal sound pressure level is low, both VCRs 48 and 49 are of high resistance and the gain of the system is maximum, remaining unchanged until the input sound pressure level reaches α. Then the resistance of the first voltage-controlled resistor 48 decreases, affecting the gain of the system. The capacitor C3, typically 0.1 μF, offers only a small impedance at low frequencies in comparison to R4 81 and R3 80 and is chosen to have a value large enough to enable effective gain control over a wide range of frequencies, yet small enough to be practical in a miniature assembly such as a hearing aid. The signal level at the output of amplifier 45 is effectively reduced by the voltage divider formed by R4 81 and voltage-controlled resistor 48 in series with R3 80. As the input signal further increases in amplitude, the resistance of VCR 48 further decreases until the input signal equals the first compressor upper bound β. At this point the VCR 48 is approximately 500Ω, small in comparison to R3 80, and further reduction of the gain of the amplifier is prohibited. The open-loop gain of the electronically-controllable amplifier decreases from 600 (56 dB) to about 86 (38.7 dB) as the input signal level increases from α to β.

The frequency response of the electronically-controllable amplifier varies significantly as VCR 48 decreases in resistance. FIG. 8 shows the compressor frequency responses at three input sound pressure levels. Curve 127 is for an input Sound Pressure Level of 25 dB; curves 128 and 129 are for inputs of 70 dB and 90 dB SPL respectively. Note the low frequency roll-off shown in curve 127 in comparison with that of curve 128. Again, the two-pole roll-off at low input levels changes to a one-pole roll-off at levels above β because the effect of C2 41 becomes insignificant when the electronically-controllable amplifier's gain is low. This is due to the frequency selective feedback around the gain block comprised of amplifiers 45, 46 and 47, as explained above with reference to FIG. 5.

The third embodiment illustrated in FIG. 7 includes electronically-controllable input signal attenuation, provided by voltage-controlled resistor 49, which shunts the signal at the junction of capacitors C1 40 and C4 50. This attenuation, however, is frequency selective as can be seen in FIG. 8 by comparing curve 128 with curve 129. Further change in the frequency response of this embodiment occurs at higher input levels above γ, because, in addition to providing attenuation of the input signal, the input attenuator network, primarily capacitor C1 40 and voltage-controlled resistor 49, contains a pole which moves to a higher frequency as the resistance of VCR 49 decreases. For example, when the input level is 90 dB, the resistance of VCR 49 is approximately 60 KΩ, which, in conjunction with capacitor C1 40 (1000 pF), is consistent with the roll-off shown in curve 129.

FIG. 9 illustrates a fourth embodiment in which the frequency response of the system is significantly influenced as input level changes. The presence of resistor R5 82 in parallel with the first input capacitor C1 40 distinguishes the circuit configuration of this embodiment from that of FIG. 7. This, along with the choice of component values shown in Table 5, results in a system with adaptive high frequency emphasis which can be of great benefit for those users with greater losses at high frequencies.

TABLE 5

| Component | Designation | Value/Gain |
| --- | --- | --- |
| amp stage 1 | 45 | 10 |
| amp stage 2 | 46 | 10 |
| amp stage 3 | 47 | 8 |
| capacitor C1 | 40 | 1000 pF |
| capacitor C2 | 41 | 4700 pF |
| capacitor C3 | 42 | 0.1 μF |
| capacitor C4 | 50 | 0.01 μF |
| resistor R1 | 43 | 150K Ω |
| resistor R2 | 44 | 2.2M Ω |
| resistor R3 | 80 | 33K Ω |
| resistor R4 | 81 | 200K Ω |
| resistor R5 | 82 | 100K Ω |

As in the embodiments of FIGS. 5 and 7, there is frequency-selective feedback around the three-stage electronically-controllable amplifier 45, 46 and 47. The component values R1 43, R2 44 and C2 41 are chosen such that a peaky high-pass filter response results. The high-frequency emphasis thus provided decreases as the gain of the amplifier block consisting of stages 45, 46 and 47 decreases from its initial value of 800 (58 dB). In many cases of hearing impairment, the loss of high frequency sensitivity at threshold is much less significant at Preferred Listening Level and the adaptive filtering action of this embodiment directly addresses this need. FIG. 10A shows the compressor frequency response curves for a variety of input signal levels. Curves 151, 152, 153 and 154 show measured compressor response for 25 dB, 30 dB, 40 dB and 50 dB input SPL respectively. This embodiment amplifies linearly between β (60 dB) and γ (80 dB), and curve 155 illustrates the compressor characteristic in that region. Curves 156, 157 and 158 are for the higher input levels 90 dB, 100 dB and 110 dB SPL. Note that the peaky 2-pole high-pass response of curve 151 becomes the single-pole high-pass response of curve 155 as the open-loop gain of the electronically-controllable amplifier is reduced from 800 (58 dB) at 25 dB input SPL to about 115 (41 dB) at levels above β (60 dB input SPL). This is not unlike the embodiments of FIGS. 5 and 7 wherein the low frequencies roll off at 12 dB per octave for low level inputs and at 6 dB per octave for intermediate and high level inputs. The adaptive high-pass filtering provided by this embodiment causes the gain at 3000 Hz to be about 20 dB greater than the gain at 1000 Hz for input signals at 25 dB SPL (α) (curve 151), whereas, for input levels greater than β, (curves 155 through 158), the gain at 3000 Hz is only about 3 dB greater than the gain at 1000 Hz. The extra gain above 1000 Hz provided for low level inputs is no longer present at Preferred Listening Level and above, which is appropriate for the great majority of high frequency losses. The embodiment of FIG. 9 also provides roll-off of low frequencies at all input levels.

The embodiment of FIG. 9 incorporates an electronically-controllable attenuator at its input, similar to FIG. 7, and this attenuator circuit also exhibits frequency selectivity which varies with its transmission. Note how the compressor frequency response varies as the input increases from 80 db (curve 155) to 110 dB (curve 158). Clearly other circuit configurations for the input attenuator will produce different frequency response characteristics at high input levels.

FIG. 10B shows the measured compression curves for the preferred embodiment of FIG. 9 at two different frequencies, 1000 Hz (curve 160) and 3000 Hz (curve 170). With reference to curve 170, two regions of linear amplification, and two regions of compression, are apparent. The first compressor lower bound, α, is at approximately 28 dB input SPL and the first compressor upper bound, β, is at approximately 60 dB input SPL. The second region of compression begins at γ, which is at about 80 dB input SPL in this embodiment. In the first region of linear amplification for low input levels, the gain $G_0$ is 30 db at 3000 Hz; in the second region of linear amplification for intermediate input levels, the gain $G_1$ is reduced to about 9 dB at 3000 Hz. In the two regions of compression the average compression ratios are approximately 2.5 and 6 respectively. The appearance of compression curve 160 for 1000 Hz signals is markedly different than the appearance of compression curve 170 for 3000 Hz signals. At 1000 Hz, amplification is nearly linear, with a gain of about 9 dB, in the first compression region 175 between α and β. This is because, although the gain of the amplifier is decreasing as the input level rises from α to β, the 1000 Hz gain relative to the 3000 Hz gain is simultaneously increasing at about the same rate.

FIGS. 11 and 12 are included to illustrate types of hearing impairments that may be significantly ameliorated with the present invention and to serve as examples. Both unaided and aided responses are shown; however, the aided responses of FIG. 12 are theoretical. The audiogram illustrated in FIG. 11 is of an individual (the inventor) with a mild and relatively flat hearing loss. This audiogram indicates for reference purposes both the upper 23 and lower 21 limits of normal hearing sensitivity thresholds, and the normal thresholds of discomfort, curve 25. The unaided thresholds of sensitivity 52 range from 2 dB to 16 dB above the upper limit of normal. Additionally, this individual's unaided threshold of discomfort at 1000 Hz 56 is indicated and is about 18 dB below normal 25. Thus, due to elevated thresholds of sensitivity in combination with lower than normal thresholds of discomfort, this person's dynamic range of hearing is narrower than normal.

Aided threshold responses are shown as curve 53 in the figure. They are all within the normal range, with the exception of 250 Hz which is only about 5 dB above normal and which is not significant for the understanding of speech. Another feature of this audiogram are the loudness balance data at Preferred Listening Level, both unaided, curve 54, and aided, curve 55. It is important to note that this individual did not require significant amplification at PLL, but did require improved threshold sensitivity and loudness tolerance. The hearing aid designed according to the present invention provided these benefits. The aided threshold of discomfort 57 is within 8 dB of normal, and the PLL loudness balance is large unaffected.

FIG. 12 shows an audiogram of an individual with a severe loss at the higher frequencies. As in FIG. 11, both unaided and aided responses are shown, but in this case the aided responses are theoretical. Upper 23 and lower 21 limits of normal hearing sensitivity thresholds, and the normal thresholds of discomfort 25, are shown for reference. This particular individual's unaided thresholds of sensitivity, curve 62, show large losses at high frequencies. Although the thresholds of sensitivity from 250 Hz to 1000 Hz are only 5 to 10 dB above normal, at 4000 Hz there is a 40 dB loss. The unaided threshold of discomfort at 1000 Hz 65 is 20 dB below normal, thus this person has a seriously reduced dynamic range of hearing. As is common with such hearing impairments, despite the compromised thresholds of sensitivity and discomfort, the Preferred Listening Level 64 is normal. In an environment with little interfering noise this person can communicate well when the talker is speaking at a usual conversational level. Of course, interphonemic loudness relationships are altered by his impairment, but nonetheless he prefers speech at a usual conversational level.

Curve 63 shows the theoretical improvement in thresholds of sensitivity which can be attained with the present invention. The preferable embodiment to employ for this individual provides high frequency emphasis, such as shown in FIG. 10A. The compression provided for high level signals would cause his threshold of discomfort to improve to near normal 66, and PLL would not be altered 64. The correction of the interphonemic loudness distortion provided by the invention will greatly improve this individual's understanding in a variety of environments, both with and without interfering noise.

FIG. 13 is included to illustrate a fifth embodiment of the invention. Here, as in FIG. 3, the first level detector 73 controls the gain of block 71 and the second level detector 74 controls the transmission of block 75. The primary difference in this configuration, however, is the inclusion of first 93 and second 96 electronically-controllable filters as well as a third level detector 95. The first electronically-controllable filter is located between the electronically-controllable amplifier block 71 and the buffer amplifier 76. Level adjust 94 is provided in order that the signal at the output of the first detector 73 can interface with both the summer 75 and the filter 93. Circuit 94 is a necessary block in the system whenever the control signal specifications for the filter 93 differ from those of the amplifier 71. The second electronically-controllable filter is located at the input of the system before the gain block 71, and its characteristics vary with the output of the third detector 95. In contrast to the third and fourth embodiments, the adaptive filtering provided is specifically designed to be independent of the compression control provided.

The level detectors 73 and 74 shown in the embodiments of FIGS. 5, 7, 9 and 13 are preferably insensitive to the frequency content of the audio signal at their inputs, where the output depends only upon the amplitude of the input signal. In cases where it is desired to control the gain of 71 in a frequency-dependent manner, filters 91 and 92, either passive or active, are included to modify the audio inputs to detectors 73 and 74 accordingly.

Although the circuit implementations shown are composed of analog components, digital components may be substituted in full or part for the analog components shown. Much of the signal processing may be performed by customized digital signal processing hardware with software written specifically to perform the signal processing tasks outlined here. With digital filtering, the analog input signal to the system would need to be converted to digital and reconverted after processing. Another approach to electronically-controllable filter design would be the use of switched-capacitor filter blocks. In any case, the control signals generated by the level detectors must be appropriate for the particular signal processing methods chosen.

In realizing the present invention, it is understood that combining certain functional blocks, such as the level detector filter 92 and the level detector 74 itself, may be desirable in order to reduce the number of components or reduce the size or cost of the apparatus and that this does not depart from the spirit of the invention. Similarly, the amplifier/limiter 72 may be combined with the detector 73. Although specific circuit implementations are discussed, those skilled in the art will recognize the availability of a great number of components and techniques to fulfill the signal processing requirements described here.

Multi-level compression greatly improves perception in a noisy environment when compared to earlier single-range compression schemes because, in addition to fully restoring hearing thresholds, background noise is presented to the user at a lower and more normal level relative to ordinary speech. The difference in level between most interfering noise and weak phonemes is not reduced, as it is in other systems which exhibit compression in the amplitude range encompassing the weak phonemes of normally-spoken speech. In the present invention, with β set to a level of 50 dB or less, typical room noise at 50 dB and weak phonemes are both linearly amplified. With the multi-level compression of the present invention, flutter is virtually eliminated because gain variations do not occur during these gaps in usual speech while common levels of noise are present.

The present invention enables the user to comfortably listen to speech processed by the device and introduced to his or her ear at appropriate sound pressure level without the presence of loud phonemic speech elements which either might mask weaker sounds or be above the threshold of discomfort. In addition, normal thresholds of sensitivity can be obtained. The compression control subsystem eliminates the need for a user-adjustable loudness control for the majority of hearing-impaired users, and provides a system requiring only a simple internal adjustment of loudness at the time of fitting for significant enhancement of hearing in all listening environments.

Rapid attack time, preferably less than 10 milliseconds, in conjunction with rapid recovery time, preferably on the order of 75 to 150 milliseconds, enables the system to respond to individual phonemes without creating forward masking of weak sounds preceded by loud sounds.

For further enhancement of speech intelligibility, an embodiment of the apparatus may contain electronically-controllable filtering which, in conjunction with one or more level detectors, enables automatic adjustment of the frequency response of the hearing aid system as a function of input level. The adaptive filtering thus provided corrects frequency-dependent loudness variations inherent in most cases of hearing impairment. Additionally, and often of greater importance, is the fact that automatic adjustment of frequency response can improve the ability to hear in noisy environments. This adaptive filtering is controlled by either one or both of the level detectors which also control the gain or by one or more other separate level detectors, also with rapid attack and recovery times.

The adaptive filters' frequency responses may vary significantly as a function of input signal level over a wide range from low levels near the threshold of sensitivity to high levels near the threshold of discomfort. In a particular embodiment, the low frequency gain of the system is varied for input signals of intensity above the second knee; thus, in noisy environments, low frequencies are processed in a manner which improves the ability to understand speech. This is accomplished by utilizing the second level detector to control filtering of low frequency energy. In another preferred embodiment, high-frequency emphasis, more pronounced for low level acoustic inputs and substantially absent at Preferred Listening Level, is provided. Here the first level detector controls the amount of high-frequency gain by adapting high-pass filter characteristics.

The apparatus and method is applicable to wearable hearing aids suited for users with mild to severe hearing impairments. The invention is also applicable to assistive communication devices which may be installed in meeting halls or churches for use by those having difficulty understanding speech emanating from a public address system. When utilized in an assistive communication device, the acoustic input signal may be derived from 1) a microphone which is located within the device, 2) a microphone situated near the device itself, 3) a microphone placed on a stage, or 4) the electrical audio output signal of a movie projector or a tape recorder or the like. The acoustic output from such an assistive communication device is delivered to the user by means of headphones or an ear piece with a built-in receiver, or by a loudspeaker, or the like, whichever is appropriate.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A hearing aid for a hearing-impaired person having a diminished dynamic range of hearing relative to a normal dynamic range of hearing, wherein the normal dynamic range of hearing has a center-point level corresponding to a sound pressure level within the diminished dynamic range of hearing at which the hearing-impaired person has no difficulty hearing, said hearing aid for enhancing the intelligibility of an acoustic input of a plurality of frequencies and having a plurality of sound pressure levels, said hearing aid comprising:

an amplifier block (71) having an electronically-controllable gain responsive to a feedback signal, said amplifier block (71) having an input signal derived from said acoustic input and for generating an output signal;

a first level detector (73) for detecting a level of said output signal corresponding to an input sound pressure level within said plurality of sound pressure levels and for generating said feedback signal therefrom, for controlling said electronically-controllable gain, wherein said electronically-controllable gain is fixed at a first fixed gain value when said input sound pressure level is below a first lower limit, said electronically-controllable gain is fixed at a second fixed gain value smaller than said first fixed gain value when said input sound pressure level is above a first upper limit, said first upper limit being at or below said center-point level, and said feedback signal controls said electronically-controllable gain according to a first leveling compressor when said input sound pressure level falls within a first compression range between said first lower limit and said first upper limit, wherein said electronically-controllable gain responds to said feedback signal when said input sound pressure level falls within said first range by decreasing as said input sound pressure level increases from said first lower limit to said first upper limit;

a power amplifier (78) for receiving and amplifying said output signal; and output means (79) for converting said output signal into an acoustic output.

2. A hearing aid as in claim 1 further comprising:

at least one second level detector (74) for detecting a level of said output signal when said input sound pressure level falls within a second range between a second lower limit above said center-point value and a maximum value of the normal dynamic range of hearing and for generating a second feedback signal therefrom; and an attenuator (75) connected to an input of said amplifier block (71) and having an electronically-controllable attenuation responsive to said second feedback signal according to a second limiting compressor when said input sound pressure level exceeds said second lower limit, wherein said electronically-controllable attenuation increases as said input sound pressure level increases beyond said second lower limit and said electronically-controllable gain decreases in response thereto.

3. A hearing aid as in claim 1 wherein said center-point level is a preferred listening level of the hearing-impaired person.

4. A device for enhancement of the intelligibility of an acoustic input of a plurality of frequencies and having a plurality of sound pressure levels within a total range having a maximum value and a minimum value representative of the normal dynamic range of hearing, the normal dynamic range of hearing having a center-point level corresponding to a sound pressure level within a diminished dynamic range of hearing at which a hearing-impaired person has no difficulty hearing, said device comprising:

an amplifier block (71) having an electronically-controllable gain responsive to a first feedback signal, said amplifier block (71) having an input signal derived from said acoustic input and generating an output signal;

a first level detector (73) for detecting a level of said output signal corresponding to said sound pressure level of said acoustic input and for generating a first feedback signal therefrom, wherein said electronically-controllable gain is fixed at a first fixed gain value in response to said acoustic input having a sound pressure level below a first lower limit, said electronically-controllable gain is fixed at a second fixed gain value in response to said acoustic input having a sound pressure level above a first upper limit, said first upper limit being less than or equal to said center-point level, said second fixed gain value being lower than said first fixed gain value, and said first feedback signal is varied by said first level detector (73) when said sound pressure level of said acoustic input falls within a first range between said first lower limit and said first upper limit, wherein said electronically-controllable gain responds to said first feedback signal when said sound pressure level of said acoustic input falls within said first range by decreasing as said sound pressure level increases from said first lower limit to said first upper limit;

at least one second level detector (74) for detecting a level of said output signal when said sound pressure level of said acoustic input falls within a second range between a second lower limit above said center-point level and the maximum value of said plurality of sound pressure levels within said total range and for generating at least one second feedback signal, wherein said input signal to said amplifier block is responsive to said second feedback signal when said sound pressure level exceeds said second lower limit, wherein said input signal to said amplifier block decreases when said sound pressure level increases beyond said second lower limit;

a power amplifier (78) for receiving and amplifying said output signal; and output means (79) for converting said output signal into an acoustic output.

5. A device as in claim 4 further comprising an attenuator (75) having an electronically-controllable attenuation responsive to said at least one second feedback signal, wherein increasing said electronically-controllable attenuation causes said electronically-controllable gain to decrease.

6. A device as in claim 4 further comprising a compression means having at least one voltage-controlled resistor (48,49) connected to said amplifier block (71) for modifying said electronically-controllable gain.

7. A device as in claim 4 further comprising an amplifier/limiter for limiting said output signal when said acoustic input exceeds said first upper limit and for amplifying said output signal when said acoustic input is less than said first upper limit.

8. A device as in claim 4 wherein said electronically-controllable gain is varied according to a first limiting compressor.

9. A device as in claim 4 wherein said electronically-controllable gain is varied according to a second limiting compressor.

10. A device as in claim 4 wherein said first level detector generates said first feedback signal according to a first compression function.

11. A device as in claim 4 wherein said at least one second level detector (74) generates said at least one second feedback signal according to a second compression function.

12. A device as in claim 4 wherein said center-point level is a preferred listening level of the hearing-impaired user.

13. A device as in claim 4 further comprising an electronically-controllable filter ((43,44,41),93,96) for providing a third feedback signal for varying said electronically-controllable gain in response to a plurality of frequency characteristics detected within said output signal corresponding to said plurality of frequencies of said acoustic input.

14. A device as in claim 13 wherein said electronically-controllable filter varies said electronically-controllable gain in response to said plurality of frequency characteristics when said sound pressure levels of said acoustic input exceed said second lower limit.

15. A device as in claim 13 wherein said plurality of frequency characteristics vary with said electronically-controllable gain.

16. A device for a hearing-impaired user having a diminished dynamic range of hearing for enhancing the intelligibility of an acoustic input having a plurality of frequencies and a plurality of sound pressure levels within a total range of sound pressure levels representative of a normal dynamic range of hearing having a maximum value, a minimum value and a center-point value, said center-point level corresponding to a sound pressure level within the diminished dynamic range of hearing at which the hearing-impaired user has no difficulty hearing, the device which comprises:

means (70) for detecting said acoustic input and generating an electrical input signal having a signal component representative of input sound pressure level wherein said total range of sound pressure levels is divided into four ranges comprising a first linear range falling below a first lower limit, a first compression range falling between said first lower limit and a first upper limit, a second linear range falling above said first upper limit and below a second lower limit and a second compression range above said second lower limit;

an amplifier block (71) for amplifying said electrical input signal with a variable gain to produce an output signal having an amplified signal component representative of said input sound pressure level;

a plurality of level detectors (73,74) for detecting said amplified signal component representative of said input sound pressure level and generating a plurality of feedback signals, said variable gain being responsive to said plurality of feedback signals, said variable gain being set at a first fixed gain value in response to detection of said amplified signal component when said input sound pressure level falls within said first linear range, said variable gain being non-linear and controlled by a first feedback signal of said plurality of feedback signals in response to detection of said amplified signal component when said input sound pressure level falls within said first compression range, said variable gain being set at a second fixed gain value less than said first fixed gain value in response to detection of said amplified signal component when said input sound pressure level falls within said second linear range, and said variable gain is non-linear and controlled by a second feedback signal of said plurality of feedback signals in response to detection of said amplified signal component when said input sound pressure level falls within said second compression range; and an acoustic output device (79) for converting said output signal into an acoustic output having enhanced intelligibility;

wherein a dynamic range of said acoustic input having input sound pressure levels falling within said first compression range is compressed in response to said first feedback signal and the dynamic range of said acoustic input having input sound pressure levels falling within said second compression range is compressed in response to said second feedback signal.

17. A device as in claim 16 further comprising:

at least one frequency responsive filter ((43,44,41),93,96) for detecting an amplified component representative of a frequency characteristic within said acoustic input signal and generating a third feedback signal of said plurality of feedback signals therefrom wherein said first lower limit is varied in response to said frequency characteristic of said acoustic input.

18. A device as in claim 16 further comprising:

at least one frequency responsive filter ((43,44,41),93,96) for detecting an amplified component representative of a frequency characteristic within said acoustic input signal and generating at least one third feedback signal therefrom wherein said second lower limit is varied in response to a said frequency characteristic of said acoustic input.

19. A device as in claim 16 wherein said center-point level is a preferred listening level of the hearing-impaired user and said first upper limit is lower than or equal to said center-point level.

20. A method for enhancing the intelligibility of an acoustic input having a plurality of frequencies and a plurality of sound pressure levels within a total range of sound pressure levels having a maximum value and a minimum value, said total range of sound pressure levels being representative of normal dynamic range of hearing, the method which comprises:

receiving said acoustic input and generating an electrical input signal therefrom (70);

amplifying said electrical input signal with an variable gain and generating an amplified output signal (71);

detecting a signal component representative of an input sound pressure level within said amplified output signal (73,74) wherein said total range of sound pressure levels is divided into four ranges comprising a first linear range falling below a first lower limit, a first compression range falling between said first lower limit and a first upper limit, a second linear range falling above said first upper limit and below a second lower limit and a second compression range above said second lower limit;

generating a plurality of feedback signals (73,74), said variable gain being responsive to said plurality of feedback signals, said variable gain being set at a first fixed gain level in response to detection of said signal component when said input sound pressure level falls within said first linear range, said variable gain being non-linear and controlled by a first feedback signal of said plurality of feedback signals with a first variable feedback value in response to detection of said signal component when said input sound pressure level falls within said first compression range, said variable gain being set at a second fixed gain value less than said first fixed gain value in response to detection of said signal component when said input sound pressure level falls within said second linear range, said second fixed gain value being less than said first fixed gain value, and said variable gain is non-linear and controlled by a second feedback signal of said plurality of feedback signals with a second variable feedback value in response to detection of said signal component when said input sound pressure level falls within said second compression range; and converting said output signal into an acoustic output having enhanced intelligibility (79);

wherein a first dynamic range of said acoustic input having input sound pressure levels falling within said first compression range is compressed in response to said first feedback signal and a second dynamic range of said acoustic input having input sound pressure levels falling within said second compression range is compressed in response to said second feedback signal.

21. A method for enhancing the intelligibility of an acoustic input having a plurality of frequencies and a plurality of sound pressure levels corresponding to a normal dynamic range of hearing having a maximum value, a minimum value and a center-point value, said center-point level corresponding to a sound pressure level within a diminished dynamic range of hearing at which a hearing-impaired person has no difficulty hearing, said method which comprises:

converting said speech into an input electrical signal (70);

amplifying said input electrical signal with a variable gain to generate an output signal from which is generated a plurality of feedback signals responsive to said plurality of sound pressure levels (71);

detecting a signal component within said output signal representative of input sound pressure levels (73);

generating a variable feedback signal of said plurality of feedback signals corresponding to said signal component when said input sound pressure levels fall within a first compression range between a first lower limit and a first upper limit below or equal to said center-point level and generating a first compression signal in response thereto (73);

fixing said variable gain at a first linear value when said input sound pressure levels fall below said first lower limit (73);

fixing said variable gain at a second linear value less that said first linear value when said input sound pressure levels exceed said first upper limit (73);

varying said variable gain in response to said first compression signal (71); and converting said output signal into an acoustic output (79).

22. A method as in claim 21 further comprising:

generating a second variable feedback signal of said plurality of feedback signals corresponding to said signal component when said input sound pressure levels fall within a second compression range above a second lower limit, said second lower limit being higher than said center-point level, and generating a second compression signal in response thereto (74); and varying said variable gain in response to said second compression signal (71).

\* \* \* \* \*